United States Patent [19]
Oashi

[11] Patent Number: 5,406,102
[45] Date of Patent: Apr. 11, 1995

[54] SEMICONDUCTOR DEVICE AND MANUFACTURING METHOD THEREOF

[75] Inventor: Toshiyuki Oashi, Hyogo, Japan

[73] Assignee: Mitsubishi Denki Kabushiki Kaisha, Tokyo, Japan

[21] Appl. No.: 253,019

[22] Filed: Jun. 2, 1994

[30] Foreign Application Priority Data

Jun. 22, 1993 [JP] Japan .................. 5-150231

[51] Int. Cl.6 .................. H01L 29/78; H01L 21/265
[52] U.S. Cl. .................. 257/296; 257/298; 257/306; 257/347; 257/350; 437/48; 437/49; 437/52; 437/59; 437/84; 437/190; 437/915
[58] Field of Search .............. 257/296, 298, 306, 347, 257/350; 437/48, 49, 52, 59, 84, 190, 915

[56] References Cited

U.S. PATENT DOCUMENTS 5,347,151  9/1994  Shimizu et al. .................. 257/347

FOREIGN PATENT DOCUMENTS 3-95937   4/1991  Japan .
4-324660  11/1992  Japan .

OTHER PUBLICATIONS

Novel SOI CMOS Design using Ultra Thin Near Intrinsic Substrate S. D. S. Malhi et al. IEDM 82, pp. 107-110 Dec. 1982.

A Buried Capacitor DRAM Cell with Bonded SOI for 256M and 1GBIT DRAMS, Toshiyuki Nishihara et al., IEDM 92, pp. 803-806 Dec. 1992.

Primary Examiner—Edward Wojciechowicz
Attorney, Agent, or Firm—Lowe, Price, LeBlanc & Becker

[57] ABSTRACT

A surface stepped portion of the top interlayer insulating layer is reduced. An insulating layer is formed on the entire surface of a silicon substrate. A silicon layer is formed on and in contact with an upper surface of insulating layer. A pair of source/drain regions are formed in silicon layer with a predetermined space. A gate electrode is formed on a region sandwiched by the pair of source/drain regions with a gate insulating layer interposed therebetween. A bit line is formed in connection with source/drain region, and extending in contact with an upper surface of insulating layer. A capacitor configured of a lower electrode layer, a capacitor insulating layer, and an upper electrode layer is formed in contact with source/drain region through a contact hole formed in an interlayer insulating layer.

21 Claims, 30 Drawing Sheets

SEMICONDUCTOR DEVICE AND MANUFACTURING METHOD THEREOF

BACKGROUND OF THE INVENTION

1. Field of the Invention

The present invention relates to semiconductor devices and a method of manufacturing the same, and more particularly, to a semiconductor device having an MOS (Metal Oxide Semiconductor) transistor using an SOI (Silicon on Insulator) structure (hereinafter referred to as an "SOI-MOSFET") and a method of manufacturing the same.

2. Description of the Background Art

With remarkable spread of information apparatuses such as computers in recent years, demand for semiconductor devices has been rapidly increased. In a functional aspect, a semiconductor device of a large storage capacity which can operate at a high speed has been required. Accordingly, a technical development relating to integration, a high response rate, or high reliability of a semiconductor device has been advanced.

A DRAM (Dynamic Random Access Memory) is generally known as a semiconductor device, which can carry out random input/output of storage information. The DRAM includes a memory cell array serving as a storage region storing a plurality of pieces of storage information, and peripheral circuits required for carrying out input/output to and from the outside.

A configuration of the DRAM will be described hereinafter.

FIG. 30 is a block diagram showing a configuration of a general DRAM.

Referring to FIG. 30, a DRAM 650 includes a memory cell array 651, a row and column address buffer 652, a row decoder 653, a column decoder 654, a sense refresh amplifier 655, a data in buffer 656, a data out buffer 657, and a clock generator Memory cell array 651 serves to store a data signal of storage information. Row and column address buffer 652 serves to receive an address buffer signal externally for selecting a memory cell configuring a unit storage circuit. Row decoder 653 and column decoder 654 serve to designate a memory cell by decoding the address buffer signal. Sense refresh amplifier 655 serves to amplify and read out a signal stored in the designated memory cell. Data in buffer 656 and data out buffer 657 serve to input or output data. Clock generator 658 serves to generate a clock signal.

Memory cell array 651 occupies a large area on a semiconductor chip of the DRAM configured as described above. Memory cell array 651 includes a plurality of memory cells for storing unit storage information arranged in a matrix manner.

FIG. 31 is an equivalent circuit diagram for four bits for explaining a configuration of the memory cell array. Referring to FIG. 31, a memory cell generally includes one MOS transistor 610 and one capacitor 630 connected thereto. The memory cell is widely known as a one-transistor/one-capacitor type memory cell. A memory cell having such a configuration is widely used in a DRAM of a large capacity, since it is easy to improve integration of a memory cell array because of its simple structure.

FIG. 32 is a cross section showing schematically a conventional semiconductor device using an SOI-MOSFET as one-transistor/one-capacitor type memory cell. FIG. 33 is a schematic cross section taken along the line H—H of FIG. 32. Referring to FIGS. 32 and 33, an insulating layer 613 is formed on the entire surface of a silicon substrate 611. Silicon layers 601 are formed as islands on the surface of insulating layer 613 MOS transistor 610 is formed using silicon layers 601 on insulating layer 613 (i.e., using an SOI structure).

MOS transistor 610 includes a gate electrode 603, a gate insulating layer 605, and a pair of source/drain regions 607. The pair of source/drain regions 607 are formed on silicon layer 601 with a predetermined space. Source/drain region 607 has an LDD (Lightly Doped Drain) structure. More specifically, source/drain region 607 is in a two-layered structure of an impurity region 607a of a relatively low concentration and an impurity region 607b of a relatively high concentration. Gate electrode 603 is formed on a region sandwiched by the pair of source/drain regions 607 with gate insulating layer 605 interposed therebetween. An insulating layer 617 is formed on silicon layer 601 so as to cover the surface of gate electrode 603.

A first interlayer insulating layer 619 is formed on the entire surface of insulating layer 613 so as to cover MOS transistor 610. A contact hole 619a reaching one of the pair of source/drain regions 607 is formed in first interlayer insulating layer 619. A capacitor 630 is formed so as to be electrically connected to source/drain region 607 through contact hole 619a.

Capacitor 630 includes a lower electrode layer 621, a capacitor insulating layer 623, and an upper electrode layer 625. Lower electrode layer (storage node) 621 is formed on first interlayer insulating layer 619 in contact with source/drain region 607 through contact hole 619a. Capacitor insulating layer 623 is formed so as to cover the surface of lower electrode layer 621. Upper electrode layer (cell plate) 625 is formed so as to cover lower electrode layer 621 with capacitor insulating layer 623 interposed therebetween.

A second interlayer insulating layer 631 is formed on the entire surface of first interlayer insulating layer 619 so as to cover capacitor 630. The first and the second interlayer insulating layers have a contact hole 631a provided reaching the other of the pair of source/drain regions 607 therethrough. A bit line 641 is formed on second interlayer insulating layer 631 in contact with source/drain region 607 through contact hole 631a.

A third interlayer insulating layer 645 is formed on the entire surface of second interlayer insulating layer 631 so as to cover the surface of bit line 641. A plurality of aluminum interconnection layers 637 patterned into a desired shape are formed on the surface of third interlayer insulating layer 645.

In such an SOI-MOSFET as described above, the space between interconnection of capacitor 630, bit line 641 or the like and silicon substrate 611 is increased by the thickness of insulating layer 613. Therefore, a capacity between interconnection and substrate, that is, a so-called interconnection capacity is reduced, and an operating speed of the circuit is increased. When such an SOI-MOSFET is applied to a CMOS, a latch-up phenomenon can also be prevented. Such an SOI-MOSFET applied to a CMOS has various advantages such as reduction of a short channel effect, improvement of a current driving ability, improvement of a subthreshold characteristic.

Therefore, when such an SOI-MOSFET is applied to a memory cell of a DRAM, a device of high reliability can be obtained in which software and latch-up are restrained, and in which a refresh characteristic is improved.

In the configuration of the conventional semiconductor device, however, MOS transistor 610, capacitor 630, and bit line 641 are formed on different layers, which causes the following problems.

Referring to FIG. 33, islands of silicon layer 601 are formed on insulating layer 613. A surface stepped portion is formed at the boundary of silicon layer 601 and insulating layer 613. Therefore, a surface stepped portion affected by the underlying stepped portion appears in first interlayer insulating layer 619 covering the stepped portion.

Lower electrode layer 621 patterned into a desired shape is formed on the surface of first interlayer insulating layer 619 having the surface stepped portion. A stepped portion is also formed at the boundary of lower electrode layer 621 and first interlayer insulating layer 619. More specifically, a stepped portion is further formed on the surface stepped portion of interlayer insulating layer 619. Second interlayer insulating layer 631 covering the stepped portion has a surface stepped portion larger than that of first interlayer insulating layer 619. As described above, i when conductive layers of devices, interconnections or the like are multi-layered, the surface stepped portion becomes more significant at the upper interlayer insulating layer out of interlayer insulating layers insulating these conductive layers.

In the conventional memory cell structure, as described above, MOS transistor 610, capacitor 630, and bit line 641 are formed on different layers. These conductive layers are in a three-layered structure. Therefore, the surface stepped portion of top interlayer insulating layer 645 becomes large. When interconnection layer 637 is patterned on interlayer insulating layer 645 having such a large surface stepped portion, it is quite difficult to pattern the interconnection layer into a desired shape. Interconnection layer 637 might be deteriorated in shape or disconnected.

FIG. 34 is a schematic plan view for explaining disconnection or deterioration in shape of the interconnection layer when the underlaying surface stepped portion is large. FIG. 35 is a schematic cross section taken along the line J—J of FIG. 34.

Referring to FIGS. 34 and 35, when the interconnection layer is formed by patterning, conductive layer 637 serving as the interconnection layer is formed on the entire surface of third interlayer insulating layer 645. Photoresist 647 is applied onto conductive layer 637. Only a desired portion 647b of photoresist 647 is exposed, whereby a resist pattern 647b of a desired shape is formed.

If there is a surface stepped portion on the underlying layer of a region 647b to be exposed, however, a region 647a not to be exposed is also exposed at the time of exposure of photoresist 647, causing deterioration in shape of the resist pattern.

In particular, in a recessed portion 645a surrounded by a projection as shown in FIG. 34, exposure light is reflected at a sidewall portion at the boundary of the projection and recessed portion 645a. As a result, exposure light is converged on the center portion of recessed portion 645a, causing a so-called convex mirror phenomenon. When the convex mirror phenomenon occurs, portion 647a serving as a resist pattern of photoresist 647 is substantially exposed. A large defect or the like of the pattern appears on resist pattern 647a, causing deterioration in shape of resist pattern 647a.

When conductive layer 637 is etched away with resist pattern 647a deteriorated in shape used as a mask, interconnection layer 637 deteriorated in shape, for example, partially reduced in width, is formed as shown in a plan view of FIG. 36. In the worst case, interconnection layer 637 may be disconnected. When interconnection layer 637 is thus deteriorated in shape, the interconnection resistance of interconnection layer 637 increases. When interconnection layer 637 is disconnected, interconnection layer 637 no longer serves as interconnection.

SUMMARY OF THE INVENTION

One object of the present invention is to reduce a surface stepped portion of the top interlayer insulating layer.

Another object of the present invention is to reduce a surface stepped portion of an interlayer insulating layer to facilitate patterning of a conductive layer on the upper surface thereof.

A still another object of the present invention is to facilitate patterning of a conductive layer to provide a semiconductor device of high electric reliability which can prevent disconnection or the like of the conductive layer and a method of manufacturing the same.

A semiconductor device according to the present invention includes a semiconductor substrate, a first insulating layer, a semiconductor layer, first and second impurity regions, a gate electrode layer, a first conductive layer, a second insulating layer, and a second conductive layer. The semiconductor substrate has a main surface. The first insulating layer is formed on the main surface of the semiconductor substrate. The semiconductor layer is of a first conductivity type, formed on the upper surface of the first insulating layer in contact therewith. First and second impurity regions are of a second conductivity type, formed in the semiconductor layer with a predetermined space. The gate electrode layer is formed on a region sandwiched by the first and the second impurity regions with the gate insulating layer interposed therebetween. The first conductive layer is connected to the first impurity region and extending on and in contact with the upper surface of the first insulating layer. The second insulating layer is formed on the first insulating layer so as to cover the semiconductor layer and the first conductive layer. The second insulating layer has an opening reaching the second impurity region. The second conductive layer is formed on the second insulating layer in contact with the second impurity region through the opening.

In the semiconductor device according to the present invention, the semiconductor layer and the first conductive layer are formed on and in contact with the upper surface of the insulating layer. More specifically, the semiconductor layer and the first conductive layer are formed on a same layer, which unnecessitates formation of an interlayer insulating layer between the semiconductor layer and the first conductive layer. As a result, a surface stepped portion of the top interlayer insulating layer is prevented from being increased significantly by a multi-layered structure. It is possible to reduce the surface stepped portion of the interlayer insulating layer formed as a top layer. Patterning of the interconnection layer on the surface of the interlayer insulating layer can be carried out with high precision. Therefore, deterioration in shape or disconnection of the interconnection layer caused by patterning can be prevented.

A method of manufacturing the semiconductor device according to the present invention includes the following steps. The first insulating layer is formed on the main surface of the semiconductor substrate. The semiconductor layer of a first conductivity type is formed on the upper surface of the first insulating layer in contact therewith. The gate electrode layer is formed on a part of the surface of the semiconductor layer with the gate insulating layer interposed therebetween. The first and the second impurity regions are formed in the semiconductor layer so as to sandwich a region of the semiconductor layer positioned directly under the gate electrode layer. The first conductive layer is connected to the first impurity region, extending on and in contact with the upper surface of the first insulating layer. The second insulating layer is formed on the first insulating layer so as to cover the semiconductor layer and the first conductive layer. The second insulating layer has an opening reaching the second impurity region. The second conductive layer is formed on the second insulating layer in contact with the second impurity region through the opening.

According to the method of manufacturing the semiconductor device of the present invention, the semiconductor device having the above-described effects can be obtained.

The foregoing and other objects, features, aspects and advantages of the present invention will become more apparent from the following derailed description of the present invention when taken in conjunction with the accompanying drawings.

DESCRIPTION OF THE PREFERRED EMBODIMENTS

Embodiments of the present invention will be described hereinafter with reference to the drawings.

Figure 1:
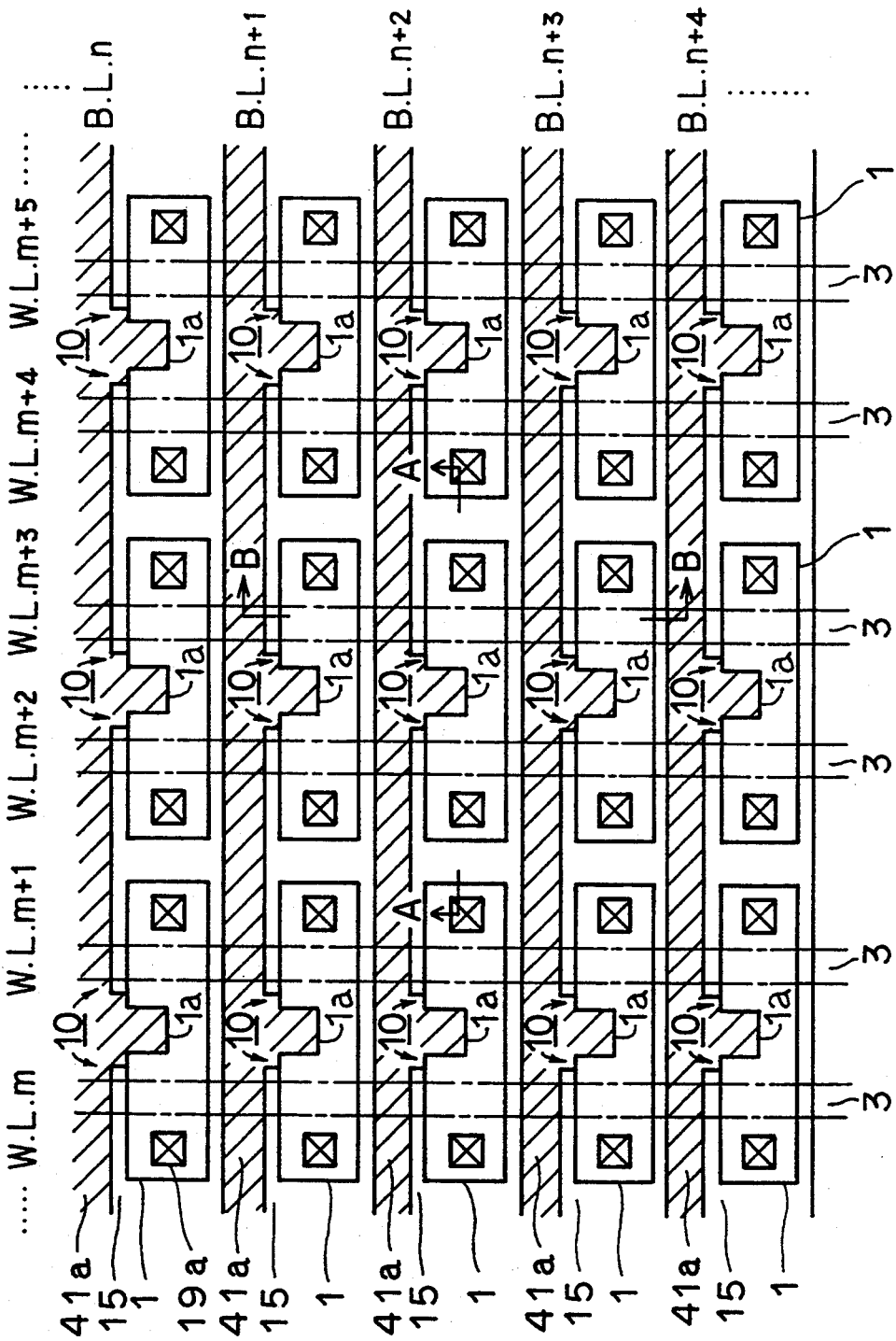
FIG. 1 is a partial plan view in a memory cell showing a configuration of a semiconductor device according to a first embodiment of the present invention.

Referring to FIG. 1, in a memory cell, a plurality of word lines W. L. $_m$, W. L. $_{m+1}$, . . ., W. L. $_{m+i}$ and a plurality of bit lines B. L. $_n$, B. L. $_{n+1}$, . . ., B. L. $_{n+j}$ are disposed orthogonal to each other. More specifically, the plurality of word lines extend in the row direction, and the plurality of bit lines extend in the column direction. A memory cell is disposed in the vicinity of a crossing of each word line 3 and each bit line 41a. The memory cell is a memory cell of one-transistor/one-capacitor type, configured of a transistor 10 and a capacitor (not shown).

Figure 2:
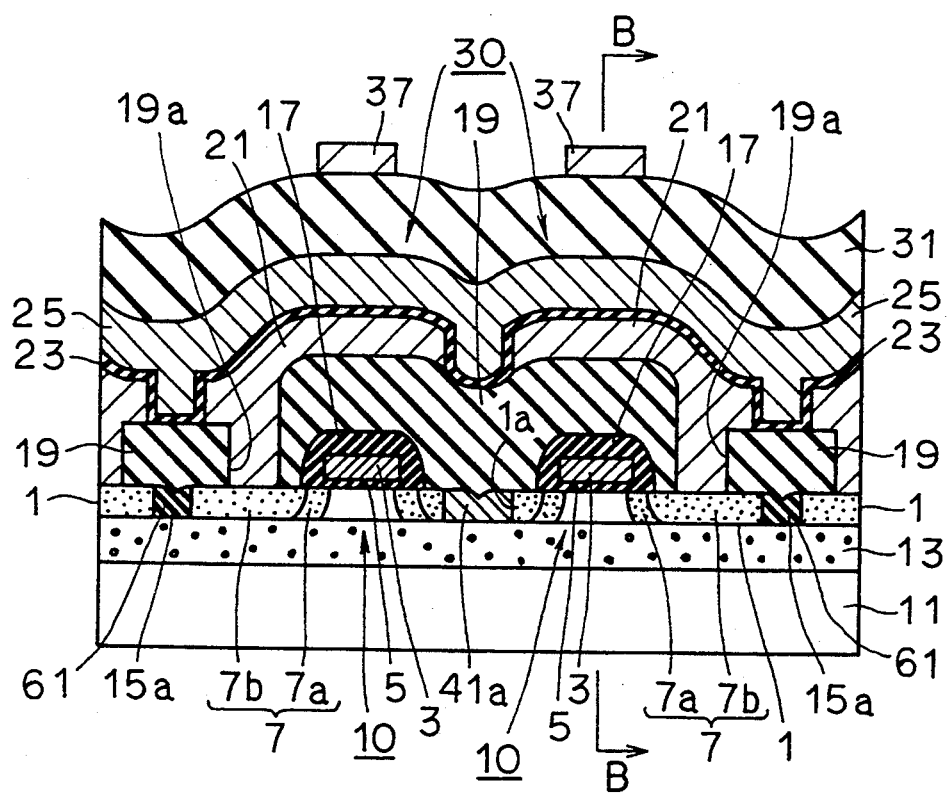
FIG. 2 is a schematic cross section taken along the line A—A of FIG. 1.
Figure 3:
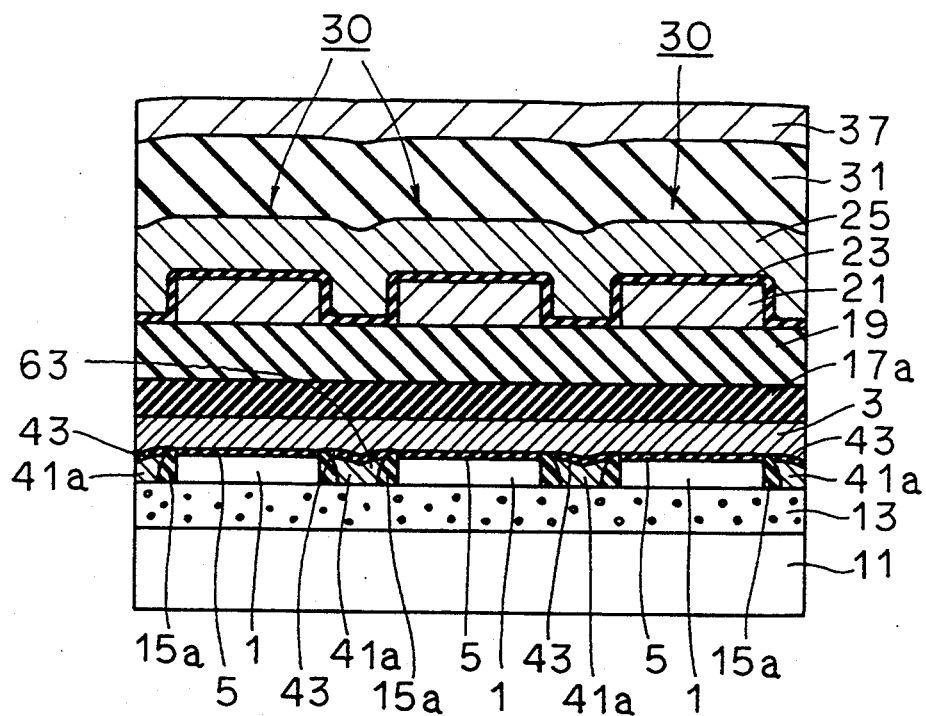
FIG. 3 is a schematic cross section taken along the line B—B of FIGS. 1 and 2.

Referring to FIGS. 2 and 3, an insulating layer 13 is formed on the entire surface of a silicon substrate 11 with a thickness of approximately 5000Å. On the surface of insulating layer 13, a plurality of silicon layers 1 are disposed in a matrix manner with a predetermined space from each other. Each silicon layer 1 has a thickness of approximately 1000Å, formed as islands. A silicon nitride layer 15a is formed so as to surround silicon layer 1. The silicon layer has a notched portion 1a having a sidewall exposed from silicon nitride layer 15a. Silicon layer 1 is in contact with bit line 41a in notched portion 1a. Bit line 41a is formed of a polycrystalline silicon layer having impurities implanted therein (hereinafter referred to as a "doped polycrystalline silicon").

A groove 61 between silicon layers 1 is filled with silicon nitride layer 15a. A groove 63 between silicon layers 1 is filled with sidewall 15a of silicon nitride and bit line 41a. More specifically, since grooves 61, 63 formed of island-shaped plural silicon layers 1 are filled with silicon nitride film 15a and bit line 41a, a stepped portion between silicon layers 1 is reduced. An MOS transistor 10 is formed by using silicon layer 1 on insulating layer 13 (that is, using an SOI structure).

MOS transistor 10 includes a gate electrode 3, a gate insulating layer 5, and a pair of source/drain regions 7. The pair of source/drain regions 7 are formed in silicon layer 1 with a predetermined space from each other. The pair of source/drain regions 7 have an LDD structure. More specifically, source/drain region 7 is structured in two layers of an impurity region 7a of a relatively low concentration and an impurity region 7b of a relatively high concentration. On a region sandwiched by the pair of source/drain regions 7, formed is gate electrode 3 with gate insulating layer 5 of a thickness of approximately 150Å interposed therebetween. The thickness of gate electrode 3 is approximately 2000Å.

An insulating layer 43 having a thickness of approximately 150Å is provided between gate electrode 3 and bit line 41a at a crossing of gate electrode 3 and bit line 41a. Insulating layer 43 insulates gate electrode 3 from bit line 41a. Bit line 41a is connected to one of the pair of source/drain regions 7 through notched portion 1a provided in silicon layer 1. An insulating layer 17 is formed on silicon layer 1 so as to cover the surface of gate electrode 3. The thickness of insulating layer 17 formed on the upper surface of gate electrode 3 is approximately 2000Å.

A first interlayer insulating layer 19 is formed on the entire surface of the substrate so as to cover MOS transistor 10. A contact hole 19a reaching the other of the pair of source/drain regions 7 is formed in first interlayer insulating layer 19. A capacitor 30 is formed electrically in contact with source/drain region 7 through contact hole 19a.

Capacitor 30 includes a lower electrode layer 21, a capacitor insulating layer 23, and an upper electrode layer 25. Lower electrode layer 21 is formed on first interlayer insulating layer 19 in contact with source/drain region 7 through contact hole 19a. The thickness of lower electrode layer 21 is approximately 2000Å. Capacitor insulating layer 23 is formed so as to cover the entire surface of lower electrode layer 21. Capacitor insulating layer 23 is structured in two layers of, for example, a silicon oxide layer and a silicon nitride layer. In this case, the silicon oxide layer and the silicon nitride layer are 150Å and 100Å in thickness, respectively. Upper electrode layer 25 of a thickness of approximately 3000Å is formed so as to cover lower electrode layer 21 with capacitor insulating layer 23 interposed therebetween.

A second interlayer insulating layer 31 is formed so as to cover capacitor 30. A plurality of aluminum interconnection layers 37 patterned into a desired shape are formed on the surface of second interlayer insulating layer 31.

A method of manufacturing the semiconductor device of the first embodiment of the present invention will now be described.

Figure 4:
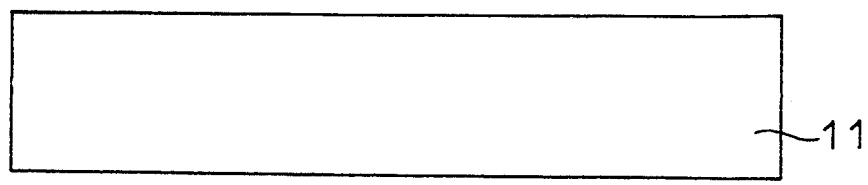
FIGS. 4 and 5 are schematic cross sections taken along the line A—A of FIG. 1 showing the first and the second steps of a manufacturing method of the semiconductor device according to the first embodiment of the present invention.

Referring to FIG. 4, silicon substrate 11 is prepared.

Figure 5:
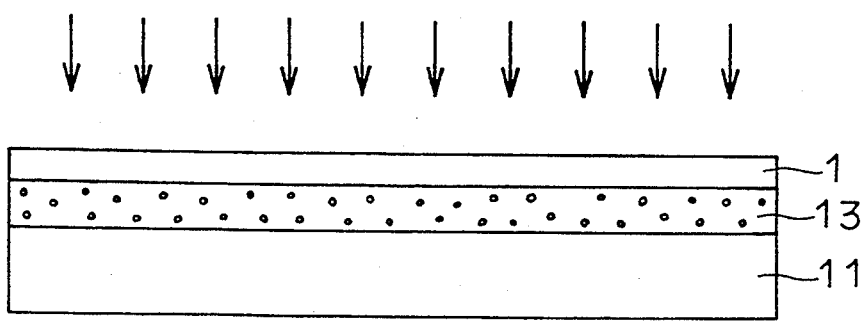

Referring to FIG. 5, with silicon substrate 11 heated to 500–600° C., oxygen ions are implanted from above silicon substrate 11. The implantation is carried out under the conditions of, for example, acceleration energy of 200 keV, and a dose rate of $2.0 \times 10^{18}/cm^2$. Implantation of the oxygen ions causes silicon substrate 11 to react with the oxygen ions, resulting in formation of insulating layer 13 of silicon oxide. Since insulating layer 13 is formed at a depth of approximately 1000Å–6000Å from the upper surface of silicon substrate 11, silicon layer 1 having a thickness of approximately 1000Å exists on insulating layer 13. Then, a heat treatment is carried out at a high temperature of, for example, 1300° C. or more in the $Ar/O_2$ atmosphere for approximately five hours. As a result, defects produced by implantation of the oxygen ions disappear, and crystallization is restored. Monocrystalline silicon layer 1 is formed.

Figure 6A:
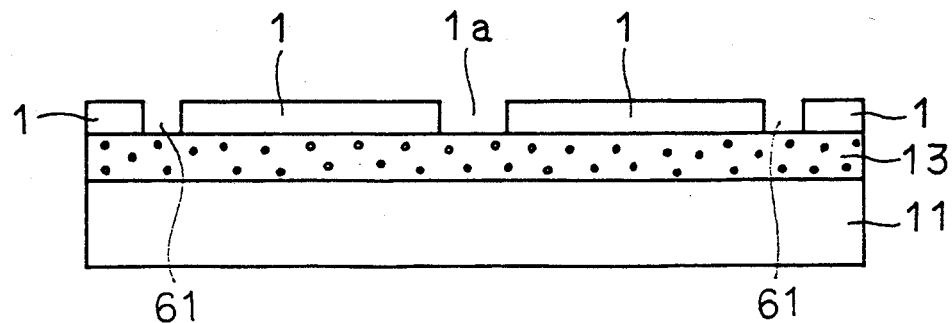
FIGS. 6A and 6B are schematic cross sections taken along the lines A—A and B—B of FIG. 1, respectively.
Figure 6B:
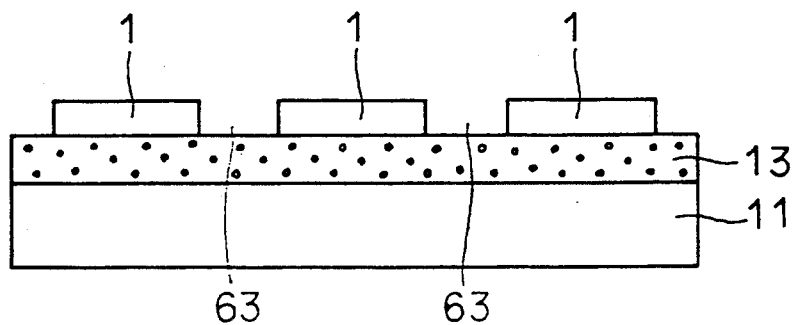
Figure 6C:
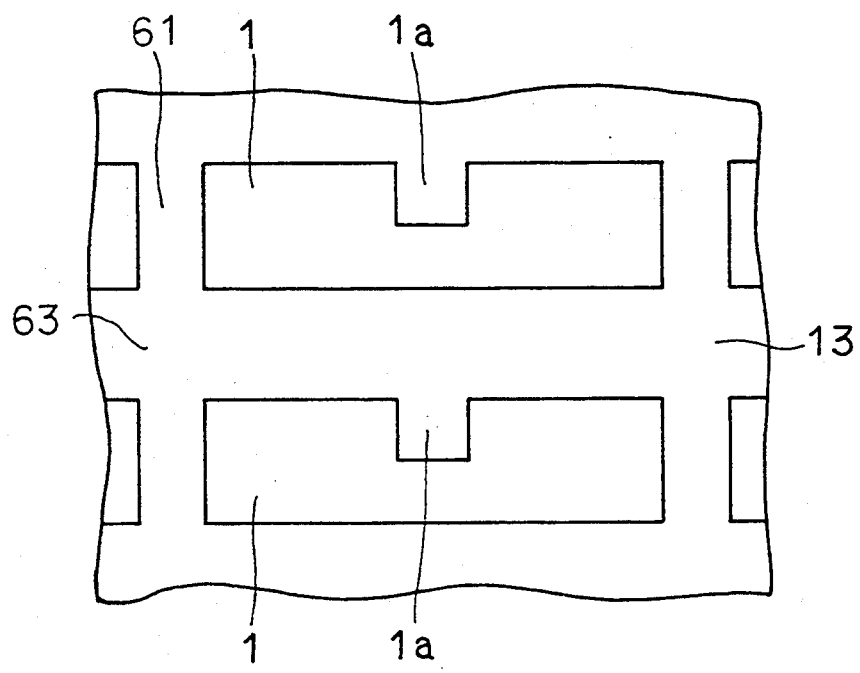
FIG. 6C is a partial plan view, showing the third step of the manufacturing method of the semiconductor device according to the first embodiment of the present invention.

Referring to FIGS. 6A, 65, and 6C, silicon layer 1 is patterned into a desired shape with a photolithography method and an etching method. Plural silicon layers 1 are formed as islands such that they have notched portions 1a. Because of island-shaped formation of silicon layers 1, grooves 61, 63 are formed between silicon layers 1.

Figure 7A:
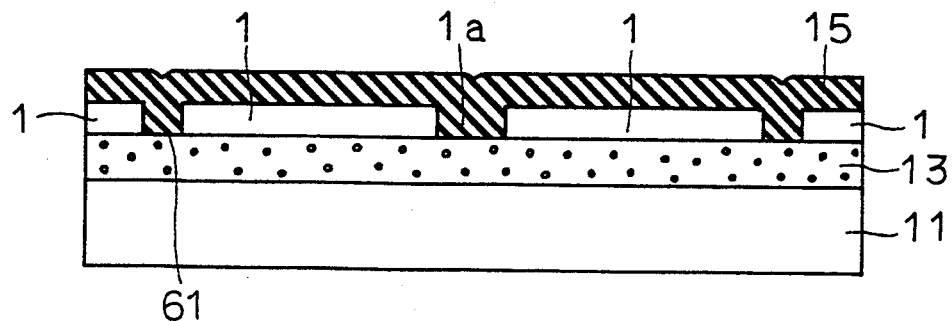
FIGS. 7A and 7B are schematic cross sections taken along the lines A—A and B—B of FIG. 1, respectively.
Figure 7B:
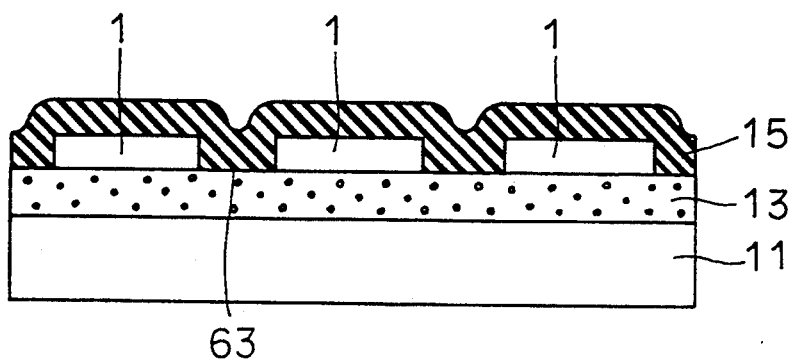
Figure 7C:
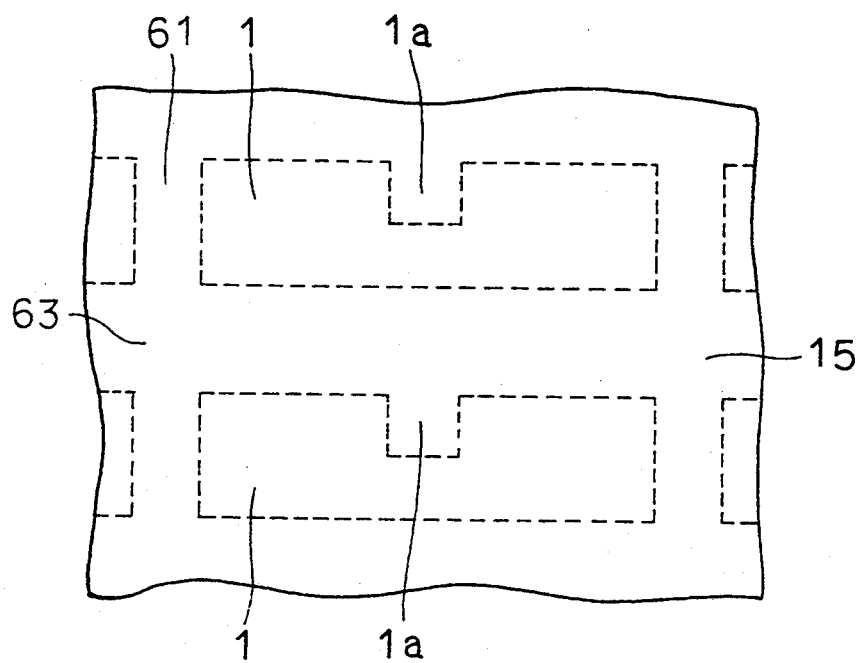
FIG. 7C is a partial plan view, showing the fourth step of the manufacturing method of the semiconductor device according to the first embodiment of the present invention.

Referring to FIGS. 7A, 7B, and 7C, silicon nitride layer 15 of a thickness of 1.2 μm or more is formed on the entire surface of substrate 11 by a CVD method. Then, the entire surface of silicon nitride layer 15 is anisotropically etched.

Figure 8A:
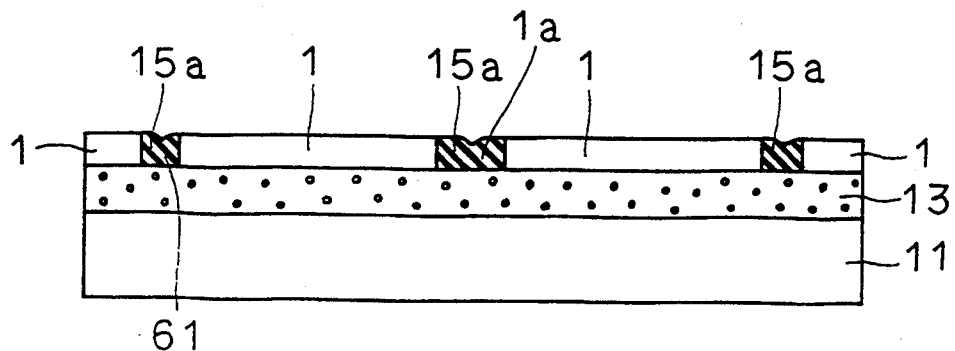
FIGS. 8A and 8B are schematic cross sections taken along the lines A—A and B—B of FIG. 1, respectively.
Figure 8B:
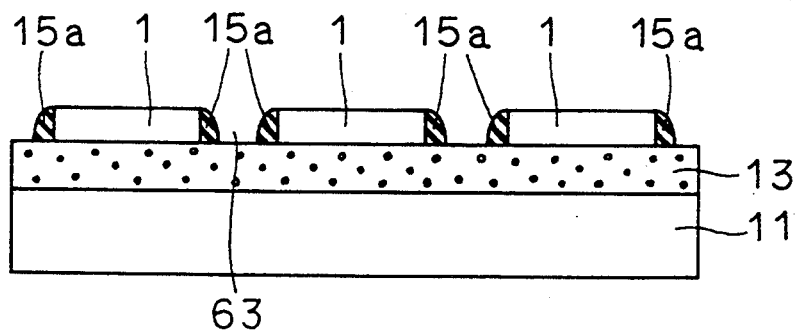
Figure 8C:
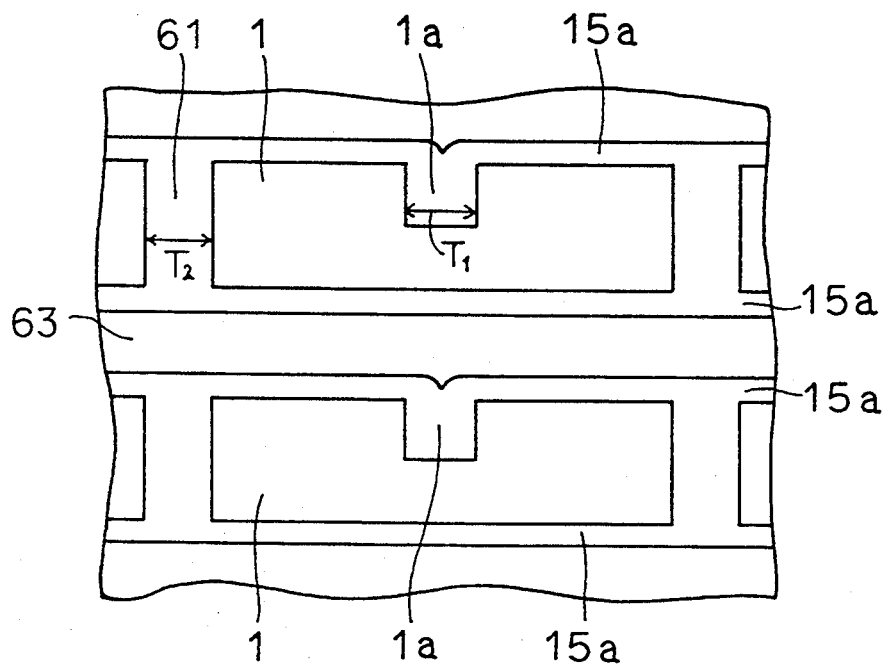
FIG. 8C is a partial plan view, showing the fifth step of the manufacturing method of the semiconductor device according to the first embodiment of the present invention.

Referring to FIGS. 8A, 8B, and 8C, by the anisotropic etching applied to the entire surface, groove 61 between silicon layers 1, and notched portion 1a are filled with silicon nitride layer 15a. On the other hand, groove 63 between silicon layers 1 is not completely filled with silicon nitride layer 15a. Silicon nitride film 15a remains on the sidewall of silicon layer 1 in a shape of a sidewall spacer.

In order to completely fill groove similar to the case of groove 61 and notched portion 1a, silicon nitride layer 15 has only to be formed to have a thickness of half or more of width $T_1$ of notched portion 1a and width $T_2$ of grooves 61 to be filled. More specifically, when width $T_1$, $T_2$ of groove 61 and notched portion 1a is 0.6 μm, silicon nitride film 15 is overetched after being formed to have a thickness of 1.2 μm or more.

Figure 9A:
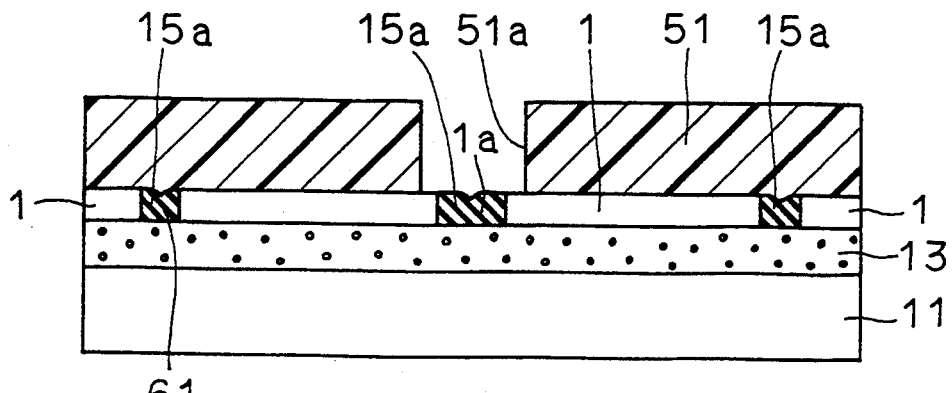
FIGS. 9A and 9B are schematic cross sections taken along the lines A—A and B—B of FIG. 1, respectively.
Figure 9B:
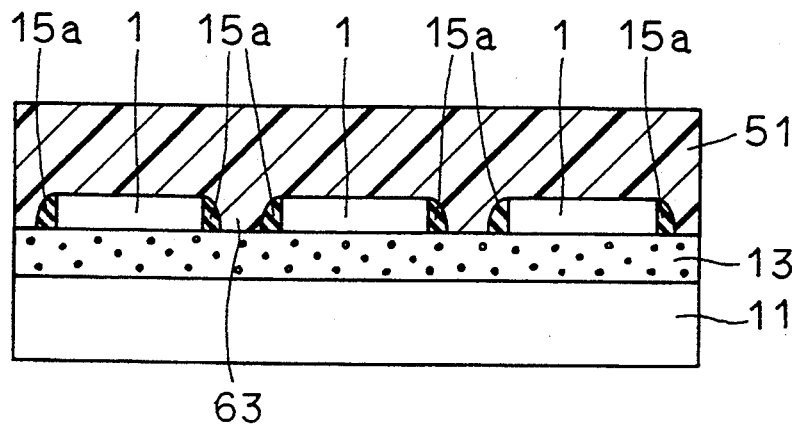
Figure 9C:
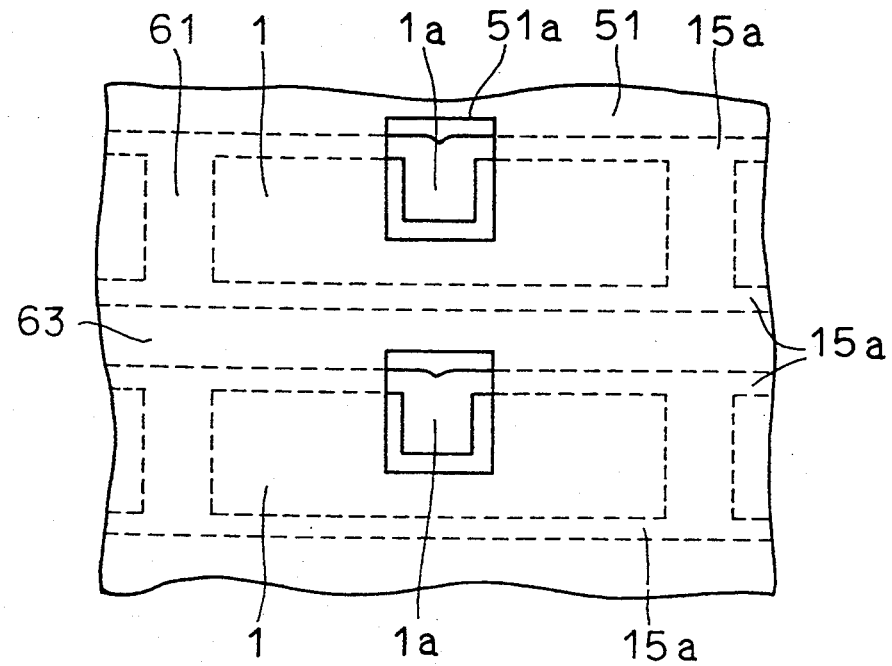
FIG. 9C is a partial plan view, showing the sixth step of the manufacturing method of the semiconductor device according to the first embodiment of the present invention.

Referring to FIGS. 9A, 9B, and 9C, photoresist 51 is applied to the entire surface of substrate 11. By exposing photoresist 51 or the like, a hole pattern 51a is formed on notched portion 1a. Silicon nitride film 15a exposed by hole pattern 51a is etched with resist pattern 51 used as a mask. The etching is carried out by a dry etching or a wet etching using hydrogen fluoride (HF), which is an overetching of 100% with respect to the thickness of silicon layer 1.

Figure 10A:
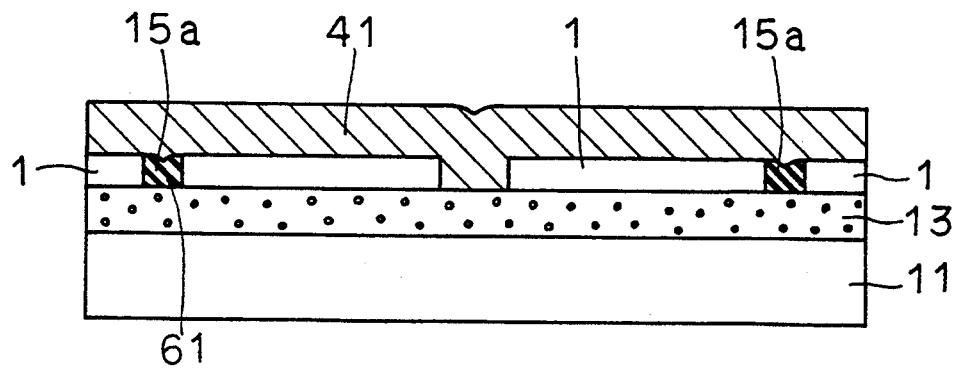
FIGS. 10A and 10B are schematic cross sections taken along the lines A—A and B—B of FIG. 1, respectively.
Figure 10B:
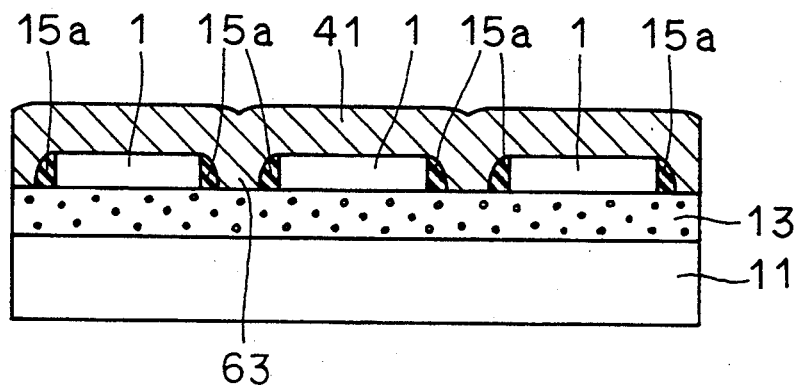
Figure 10C:
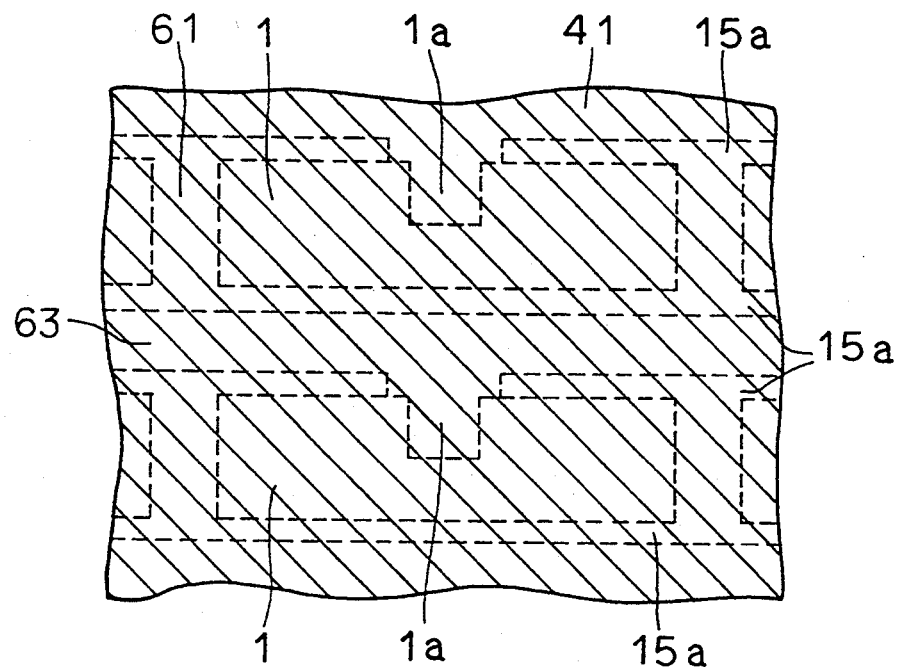
FIG. 10C is a partial plan view, showing the seventh step of the manufacturing method of the semiconductor device according to the first embodiment of the present invention.

Referring to FIGS. 10A, 10B, and 10C, silicon nitride film 15a filled into notched portion 1a is etched away, and sidewalls of silicon layer 1 are exposed in notched portion 1a. Then, resist pattern 51 is removed. A doped polycrystalline silicon layer 41 is formed on the entire surface of substrate 11. The entire surface of doped polycrystalline silicon layer 41 is anisotropically etched.

Figure 11A:
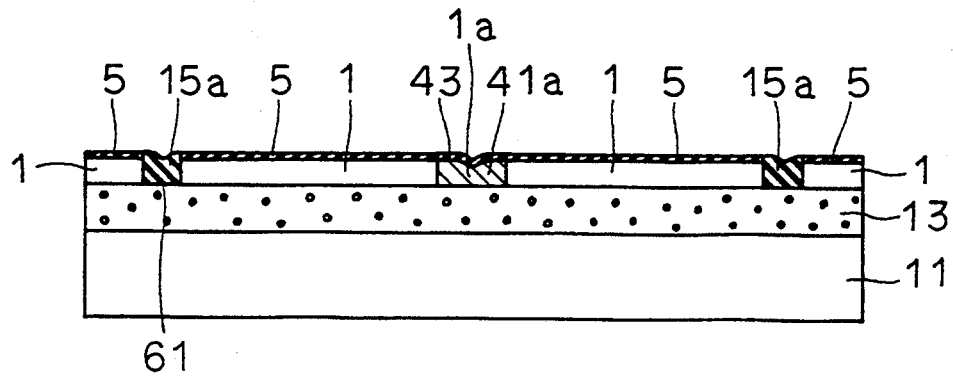
FIGS. 11A and 11B are schematic cross sections taken along the lines A—A and B—B of FIG. 1, respectively.
Figure 11B:
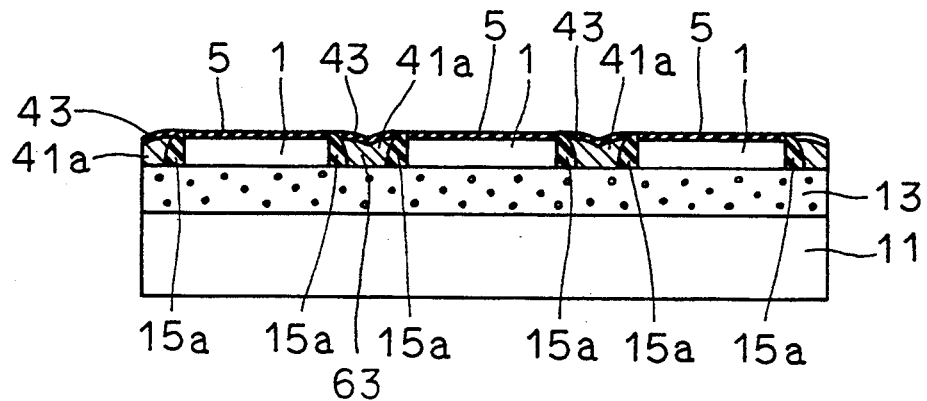
Figure 11C:
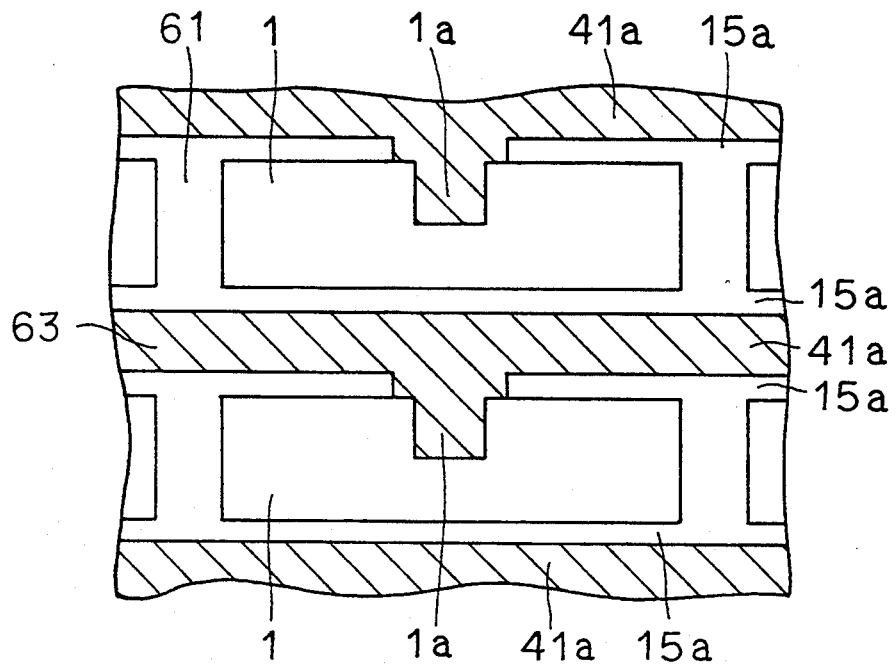
FIG. 11C is a partial plan view, showing the eighth step of the manufacturing method of the semiconductor device according to the first embodiment of the present invention.

Referring to FIGS. 11A, 11B, and 11C, bit line 41a with which notched portion 1a is filled and groove 63 is formed by the etching. Bit line 41a is in contact with sidewalls of silicon layer 1 in notched portion 1a. Then, silicon oxide films 5 and 43 of a thickness of approximately 150Å are formed on the upper surface of silicon layer 1 and on the upper surface of bit line 41a of polycrystalline silicon, respectively, by a heat oxidation treatment.

Figure 12A:
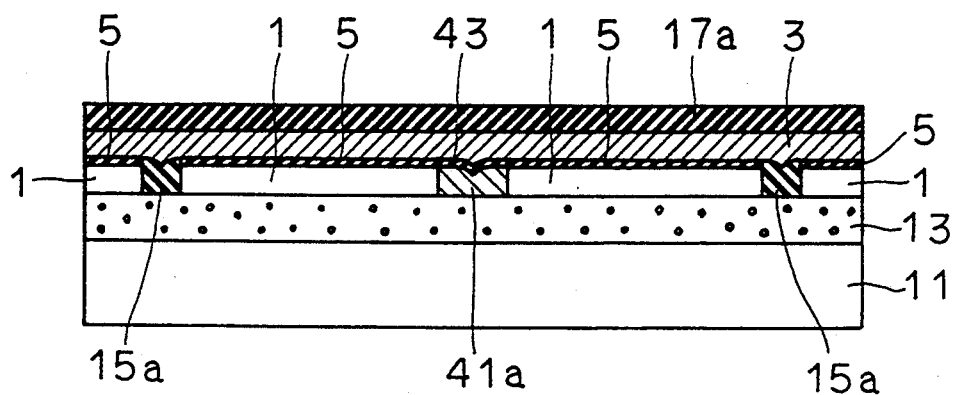
FIGS. 12A and 12B are schematic cross sections taken along the lines A—A and B—B of FIG. 1, respectively, showing the ninth step of the manufacturing method of the semiconductor device according to the first embodiment of the present invention.
Figure 12B:
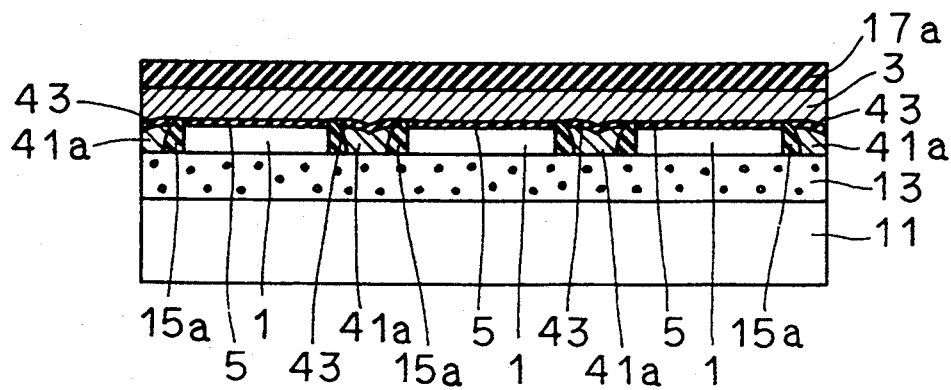

Referring to FIG. 12A and 12B, grooves 61, 63 and notched portion 1a are filled with silicon nitride film 15a and bit line 41a. A doped polycrystalline silicon layer 3 of a thickness of approximately 2000Å is formed by the CVD method on the entire surface of the substrate having its upper surface planarized. A silicon oxide layer 17a of a thickness of approximately 2000Å is formed on the entire surface of doped polycrystalline silicon layer 3 by the CVD method.

Figure 13A:
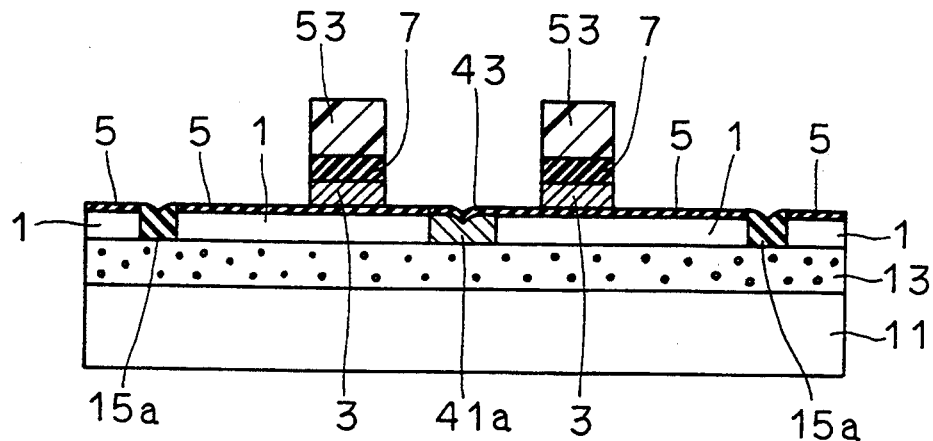
FIGS. 13A and 13B are schematic cross sections taken along the lines A—A and B—B of FIG. 1, respectively, showing the tenth step of the manufacturing method of the semiconductor device according to the first embodiment of the present invention.
Figure 13B:
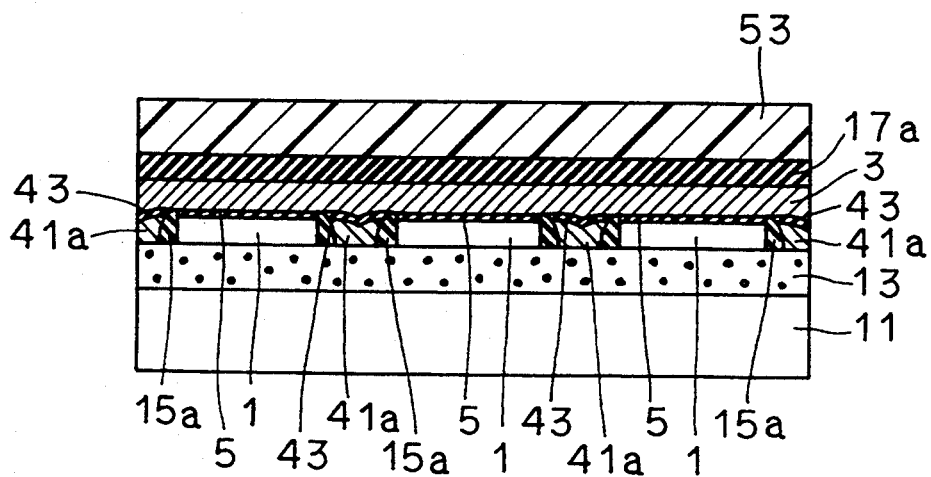

Referring to FIGS. 13A and 13B, a resist pattern 53 having a desired shape is formed on the surface of silicon oxide film 17a. With resist pattern 53 used as a mask, silicon oxide layer 17a and doped polycrystalline silicon layer 3 are sequentially etched away, and patterned. By the patterning, gate electrode 3 of doped polycrystalline silicon is formed. Then, resist pattern 53 is removed.

Figure 14A:
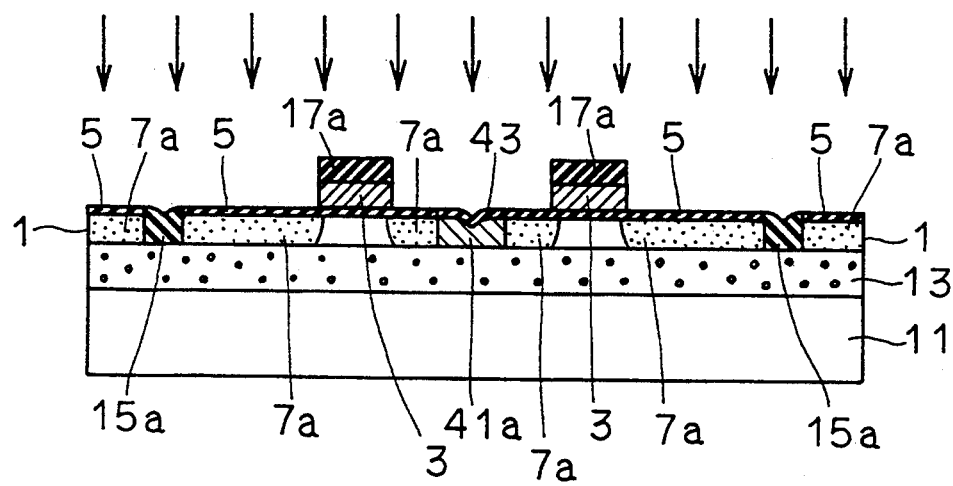
FIGS. 14A and 14B are schematic cross sections taken along the lines A—A and B—B of FIG. 1, respectively, showing the eleventh step of the manufacturing method of the semiconductor device according to the first embodiment of the present invention.
Figure 14B:
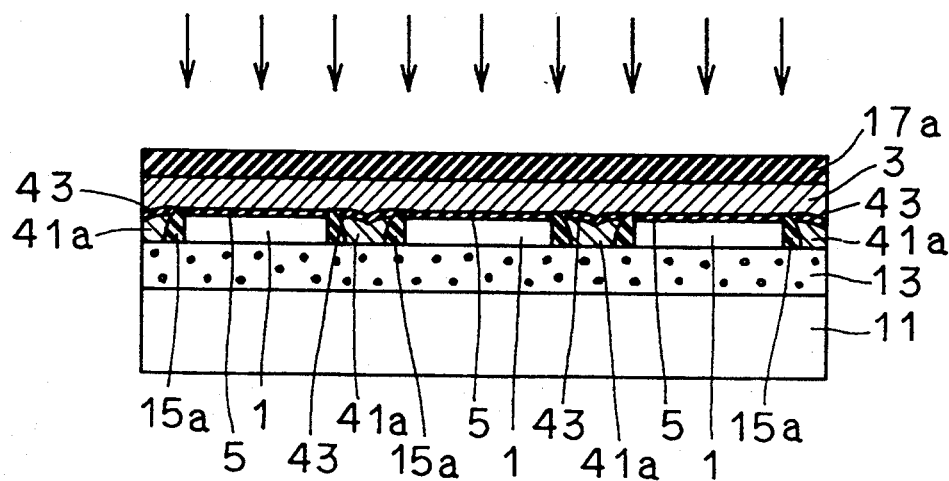

Referring to FIGS. 14A and 14B, ions are implanted into silicon layer 1 with silicon oxide layer 17a and gate electrode 3 used as a mask. By the ion implantation, a pair of impurity regions 7a of a relatively low concentration is formed so as to sandwich a region under gate electrode 3.

Figure 15A:
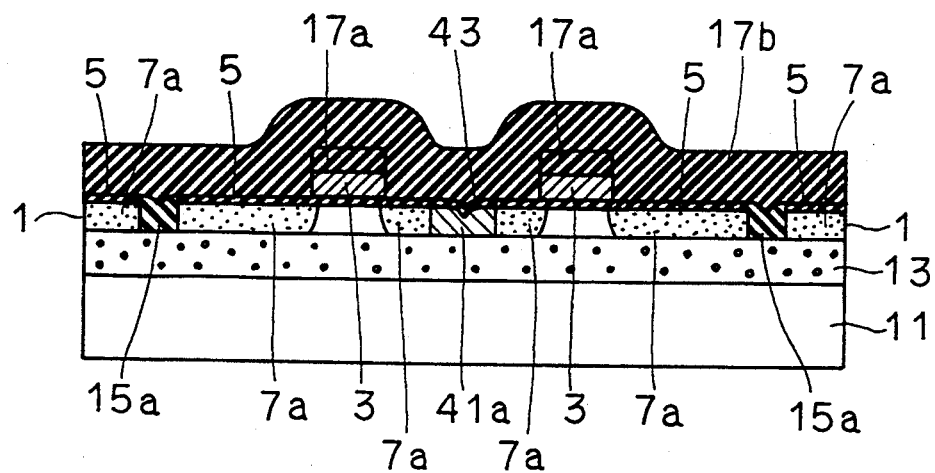
FIGS. 15A and 15B are schematic cross sections taken along the lines A—A and B—B of FIG. 1, respectively, showing the twelfth step of the manufacturing method of the semiconductor device according to the first embodiment of the present invention.
Figure 15B:
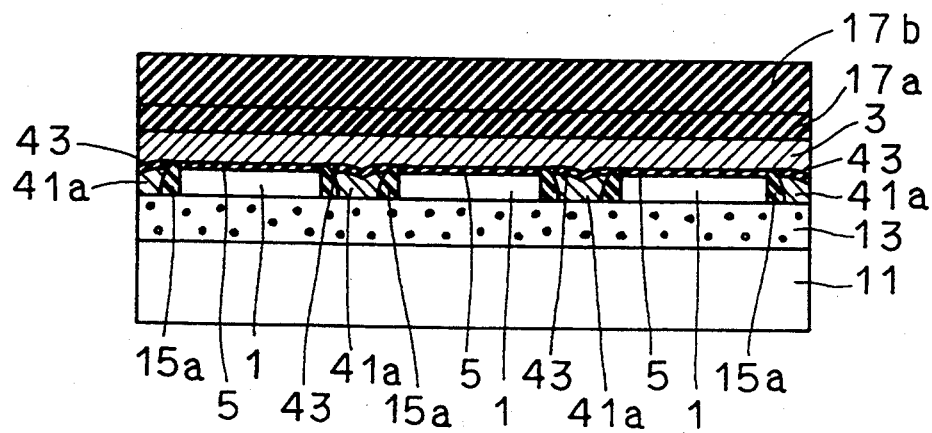

Referring to FIGS. 15A and 15B, a silicon oxide layer 17b is formed on the entire surface of the substrate by the CVD method. The entire surface of silicon oxide layer 17b is anisotropically etched.

Figure 16A:
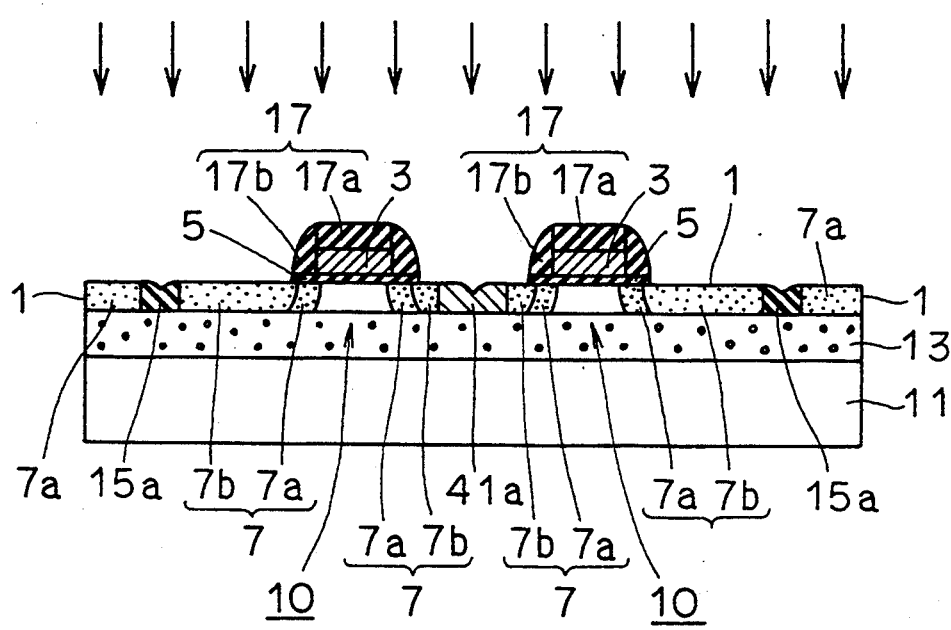
FIGS. 16A and 16B are schematic cross sections taken along the lines A—A and B—B of FIG. 1, respectively, showing the thirteenth step of the manufacturing method of the semiconductor device according to the first embodiment of the present invention.
Figure 16B:
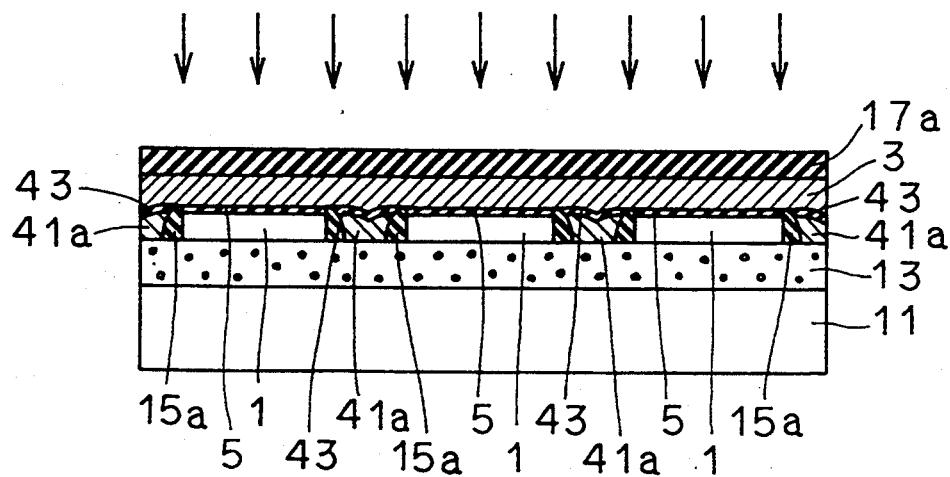

Referring to FIGS. 16A and 16B, by the anisotropical etching, a sidewall 17b is formed so as to cover sidewalls of gate electrode 3 and silicon oxide layer 17a. Insulating layer 17 covering the surface of gate electrode 3 is formed of silicon oxide layers 17a and 17b. Ions are again implanted into silicon layer 1 with insulating layer 17 and gate electrode 3 used as a mask. By the ion implantation, a pair of impurity regions 7b of a relatively high concentration is formed so as to sandwich a region under insulating layer 17. Source/drain region 7 of an LDD structure is formed Of impurity region 7b of a relatively high concentration and impurity region 7a of relatively low concentration. MOS transistor 10 is structured of the pair of source/drain regions 7, gate insulating film 5, and gate electrode 3.

Figure 17A:
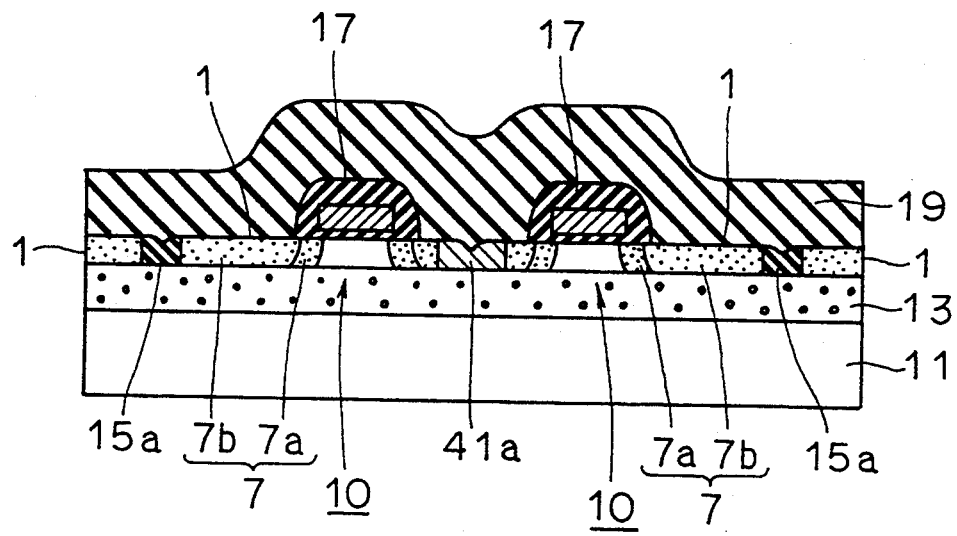
FIGS. 17A and 17B are schematic cross sections taken along the lines A—A and B—B of FIG. 1, respectively, showing the fourteenth step of the manufacturing method of the semiconductor device according to the first embodiment of the present invention.
Figure 17B:
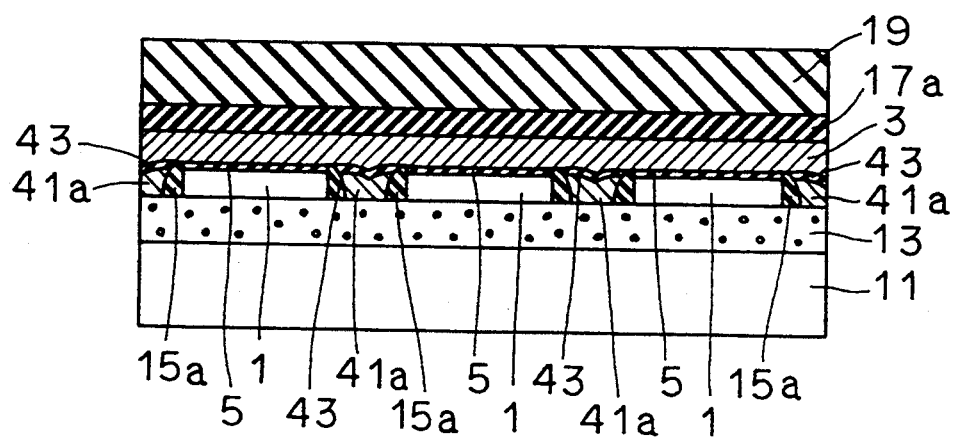

Referring to FIGS. 17A and 17B, a first interlayer insulating layer 19 of a thickness of approximately 4000Å is formed of, for example, silicon oxide, on the entire surface of the substrate so as to cover MOS transistor 10.

Figure 18A:
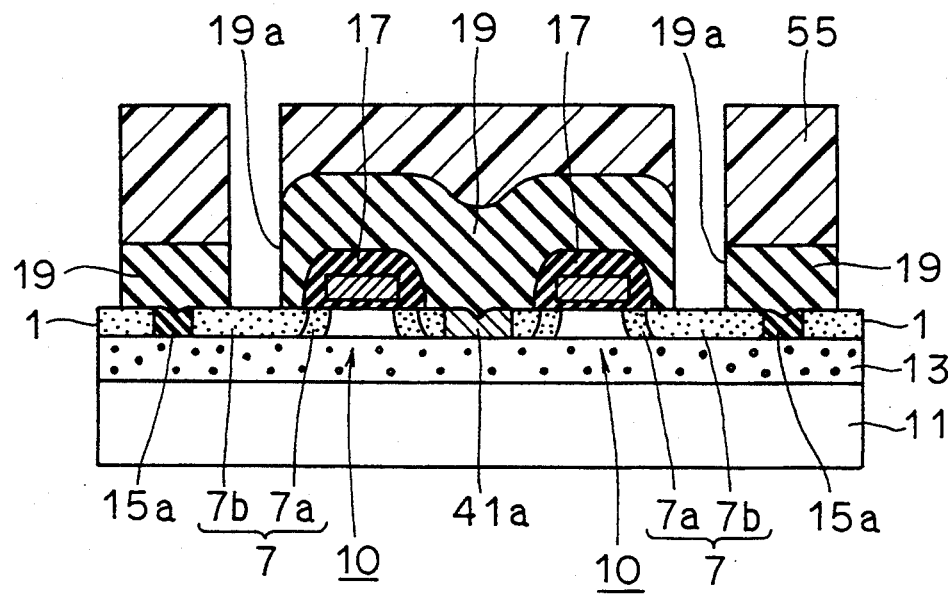
FIGS. 18A and 18B are schematic cross sections taken along the lines A—A and B—B of FIG. 1, respectively, showing the fifteenth step of the manufacturing method of the semiconductor device according to the first embodiment of the present invention.
Figure 18B:
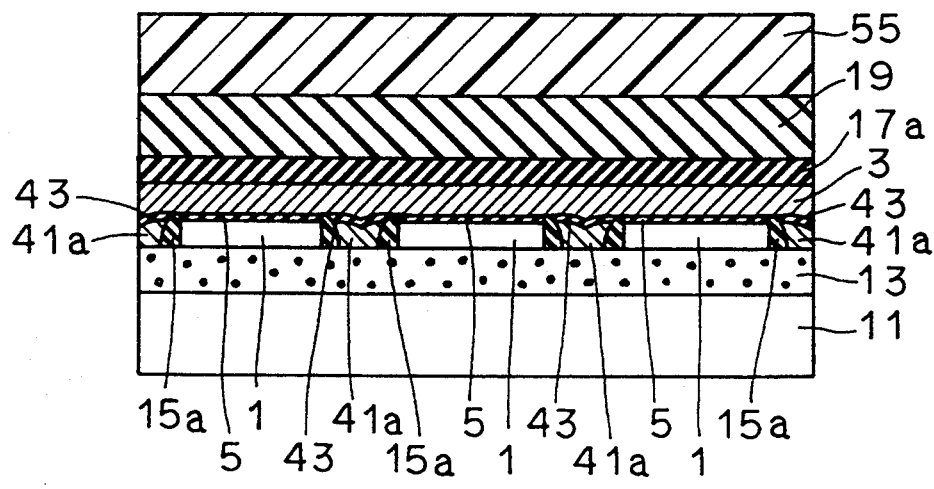

Referring to FIGS. 18A and 18B, photoresist 55 is applied to the entire surface of first interlayer insulating layer 19. Photoresist 55 is patterned by exposure or the like. With resist pattern 55 used as a mask, first interlayer insulating layer 19 is anisotropically etched, and contact hole 19a having an opening diameter of approximately 0.6 μm is formed. The surface of one of the pair of source/drain regions 7 is exposed through contact hole 19a. Then, resist pattern 55 is removed.

Figure 19A:
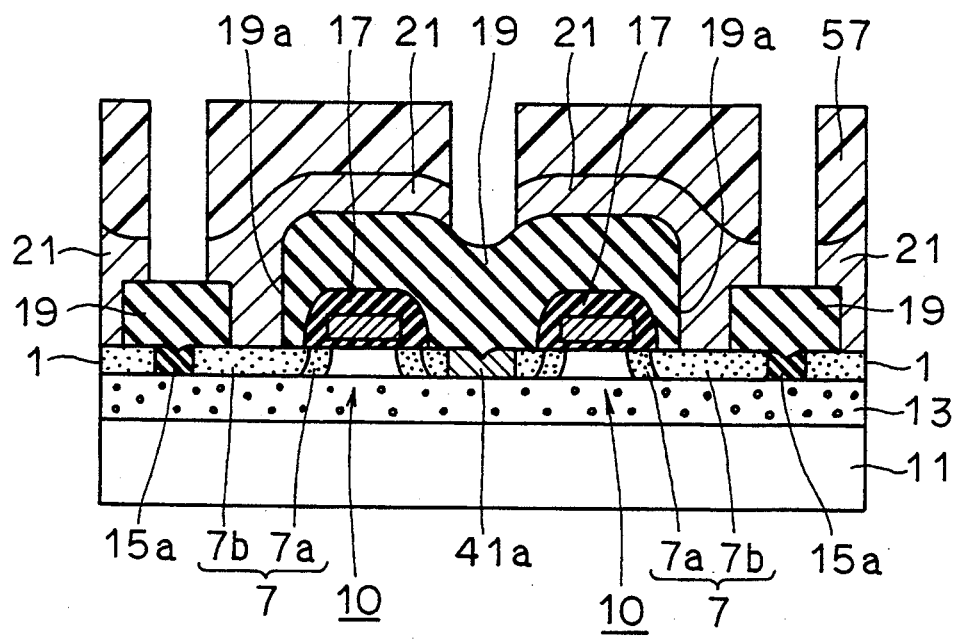
FIGS. 19A and 19B are schematic cross sections taken along the lines A—A and B—B of FIG. 1, respectively, showing the sixteenth step of the manufacturing method of the semiconductor device according to the first embodiment of the present invention.
Figure 19B:
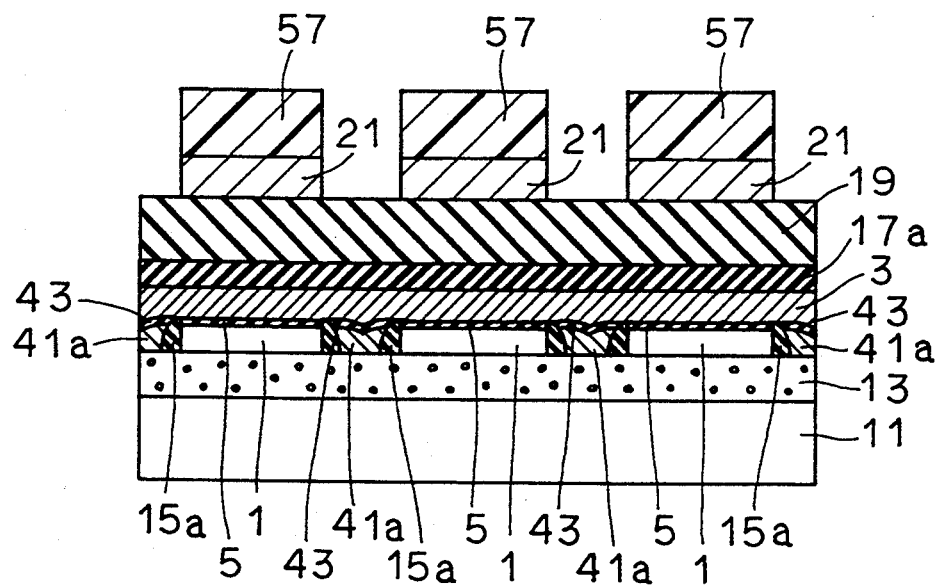

Referring to FIGS. 19A and 19B, a doped polycrystalline silicon layer 21 of a thickness of approximately 2000Å is formed on the entire surface of first interlayer insulating layer 19 in contact with source/drain region 7 through contact hole 19a. Resist pattern 57 having a desired shape is formed on the surface of doped polycrystalline silicon layer 21. Doped polycrystalline silicon layer 21 is patterned by etching with resist pattern 57 used as a mask. By the patterning, lower electrode layer 21 in contact with source/drain region 7 is formed. Then, resist pattern 57 is removed.

Figure 20A:
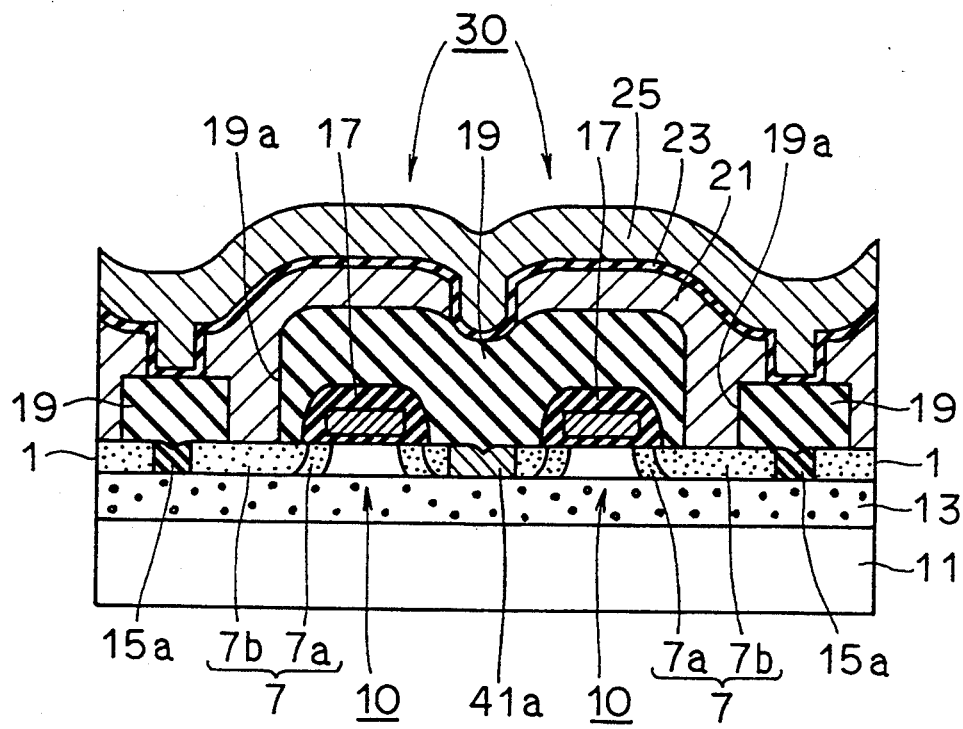
FIGS. 20A and 20B are schematic cross sections taken along the lines A—A and B—B of FIG. 1, respectively, showing the seventeenth step of the manufacturing method of the semiconductor device according to the first embodiment of the present invention.
Figure 20B:
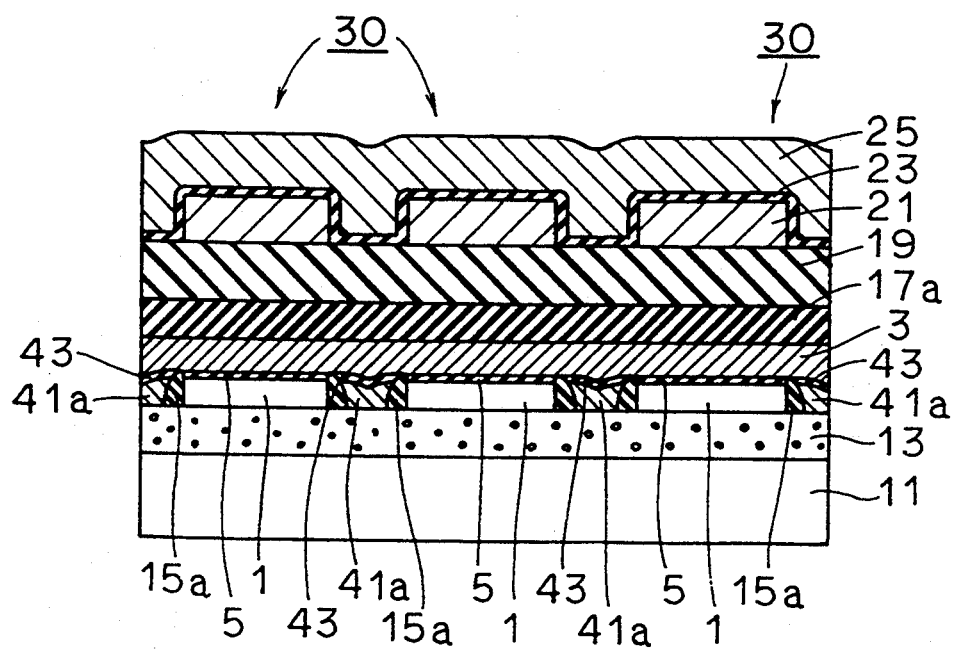

Referring to FIGS. 20A and 20B, capacitor insulating layer 23 is formed so as to cover the entire surface of lower electrode layer 21. Capacitor insulating layer 23 is formed by a silicon oxide layer and a silicon nitride layer of approximately 150Å and 100Å being deposited by the CVD method. Upper electrode layer 25 of doped polycrystalline silicon is formed by the CVD method with a thickness of approximately 3000Å so as to cover lower electrode layer 21 with capacitor insulating layer 23 interposed therebetween. Capacitor 30 is structured of lower electrode layer 21, capacitor insulating layer 23, and upper electrode layer 25.

Figure 21A:
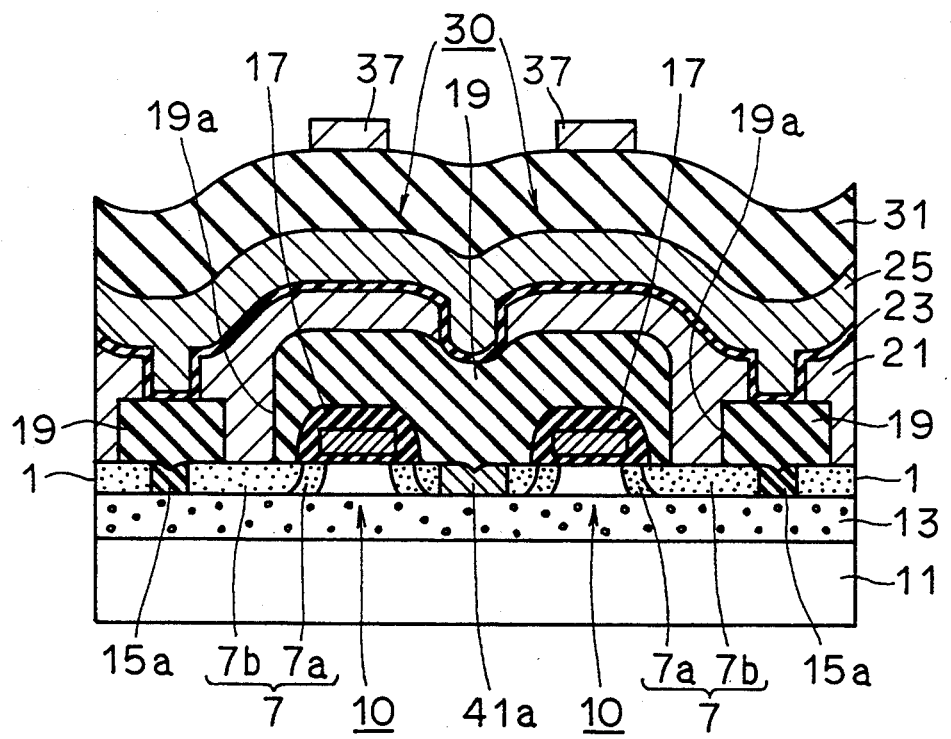
FIGS. 21A and 21B are schematic cross sections taken along the lines A—A and B—B of FIG. 1, respectively, showing the eighteenth step of the manufacturing method of the semiconductor device according to the first embodiment of the present invention.
Figure 21B:
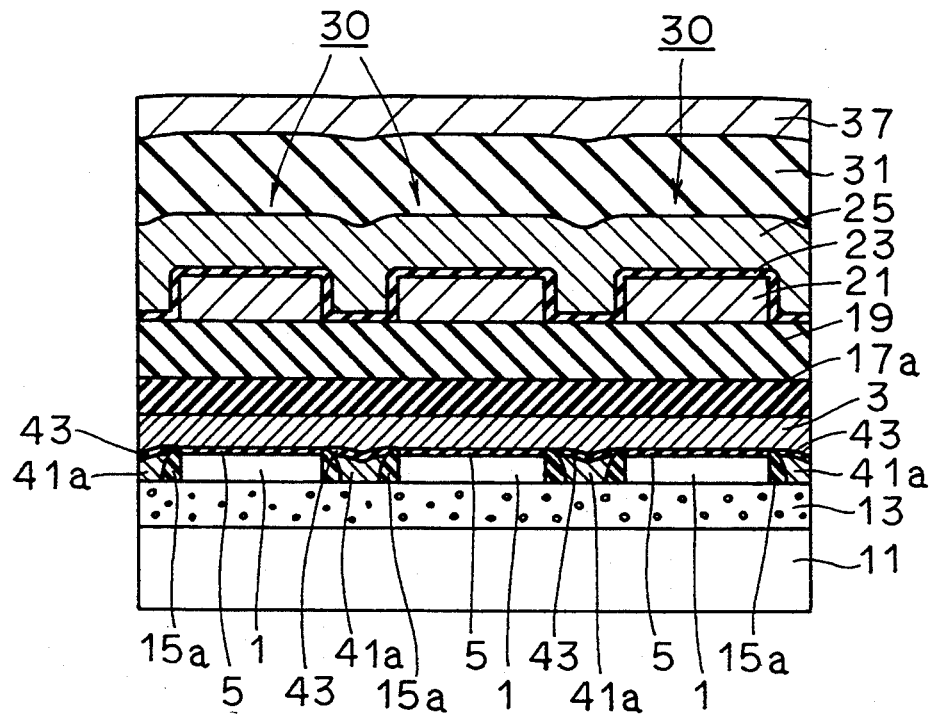

Referring to FIGS. 21A and 21B, silicon oxide layer 31 of a thickness of approximately 10000Å is formed so as to cover capacitor 30. A resist film (not shown) is formed on the surface of silicon oxide layer 31 for planarizing the same. The resist film may be a film formed by application of an SOG (Spin On Glass) film. Then, the resist film and silicon oxide layer 31 are etched back. As a result, a second interlayer insulating layer 31 is formed having its surface relatively planarized and having a thickness of 7000Å at a portion of the largest film thickness. An aluminum layer of a thickness of approximately 5000Å is formed by a sputtering method on the surface of second interlayer insulating layer 31. Then, the aluminum interconnection is patterned by a photolithography method and a dry etching method, whereby an aluminum interconnection layer 37 having a desired shape is formed.

In this embodiment, silicon layer 1 and bit line 41a are formed on and in contact with the upper surface of insulating layer 13. More specifically, since silicon layer 1 and bit line 41a are formed on a same layer, it is possible to reduce the number of interlayer insulating layers between silicon layer 1 and bit line 41a by one layer as compared to a structure of the conventional semiconductor device. In a structure of the semiconductor device of this embodiment, significant increase of a surface stepped portion of the top interlayer insulating layer because of a multi-layered structure can be inhibited. That is, the surface stepped portion of the top interlayer insulating layer 31 can be reduced by one interlayer insulating layer. Interconnection layer 37 can be patterned on the surface of the top interlayer insulating layer with high precision. Therefore, it can be prevented that the interconnection layer is deteriorated in shape or disconnected by patterning.

In the case where SOI-MOSFET 10 is used as in the case of this embodiment, stepped portions caused by grooves 61, 63 appear in respective silicon layers 1 because of formation of respective silicon layers 1 as islands. However, groove 61 is filled with silicon nitride layer 15a, and groove 63 with silicon nitride layer 15a and bit line 41a. The upper surface of silicon nitride layer 15a and bit line 41a filled into grooves 61, 63 is substantially flush with the upper surface of respective silicon layers 1. As a result, the stepped portion caused by the groove between silicon layers 1 is reduced, and a substantially flat surface is implemented.

As described above, since the stepped portion caused by the groove between silicon layers 1 is reduced in this embodiment, it is possible to reduce the surface stepped portion of the top interlayer insulating layer 31.

In addition, since the stepped portion caused by the groove between silicon layers 1 is reduced, precision at the time of patterning of gate electrode layer 3 increases which extends on silicon layers 1. Therefore, gate electrode layer 3 is not likely to suffer from deterioration in shape or disconnection, and fabrication of MOS transistor 10 having a desired characteristic is facilitated.

It should be noted that notched portion 1a is provided in silicon layer 1 in this embodiment. It is structured that bit line 41a and source/drain region 7 formed in silicon layer 1 are in contact with each other in notched portion 1a. The present invention, however, is not limited thereto. Description will be given hereinafter of second and third embodiments in which the source/drain region in the silicon layer and the bit line are connected without provision of a notched portion in the silicon layer.

Figure 22:
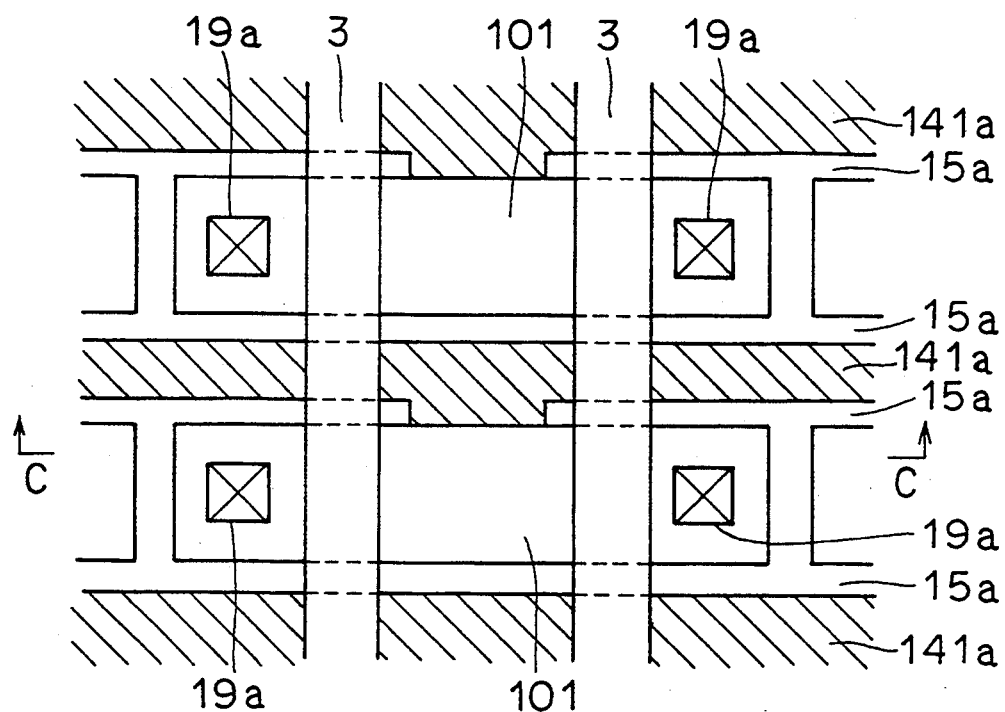
FIG. 22 is a plan view schematically showing a configuration of a semiconductor device according to a second embodiment of the present invention.
Figure 23:
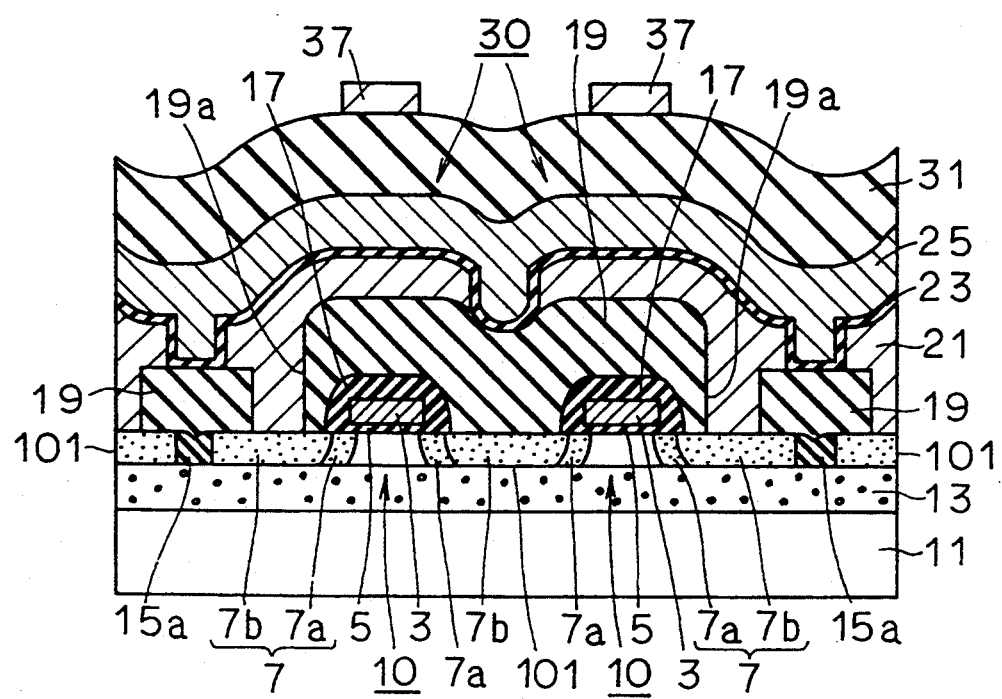
FIG. 23 is a schematic cross section taken along the line C—C of FIG. 22.

Referring to FIGS. 22 and 23, a notched portion is not provided in silicon layer 101. A notched portion is provided in a part of silicon nitride layer 15a surrounding silicon layer 101. A sidewall of silicon layer 101 is exposed in part in the notched portion of silicon nitride layer 15a. A bit line 141a is in contact with the exposed sidewall of silicon layer 101. As a result, source/drain region 7 in silicon layer 101 shared by both transistors 10, and bit line 141a are electrically connected.

Since the other configuration is substantially the same as that of the first embodiment, description will not be repeated.

Figure 24:
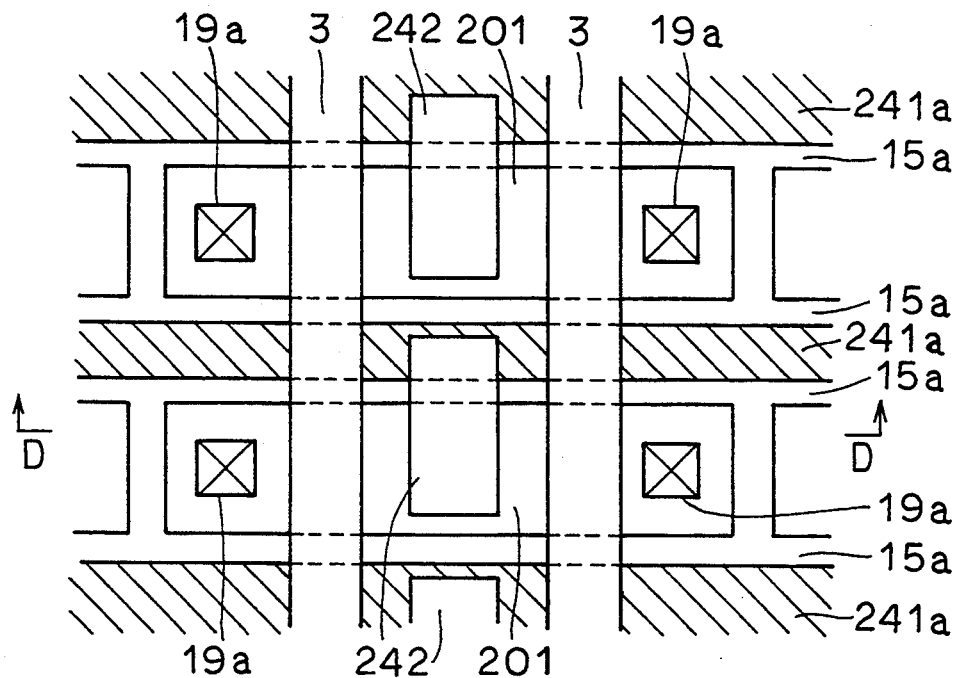
FIG. 24 is a plan view schematically showing a configuration of a semiconductor device according to a third embodiment of the present invention.
Figure 25:
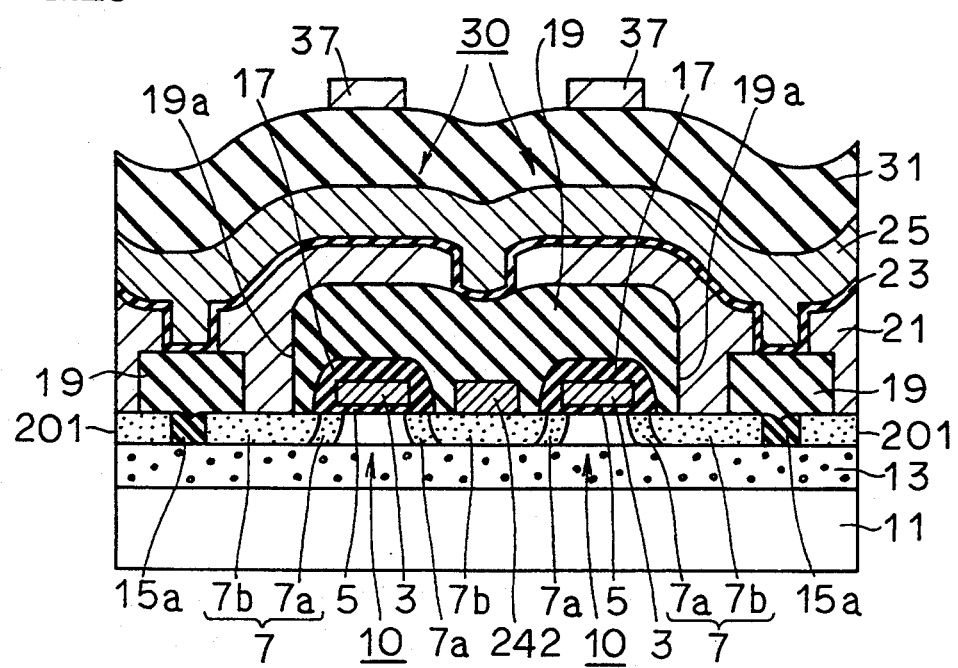
FIG. 25 is a schematic cross section taken along the line D—D of FIG. 24.

Referring to FIGS. 24 and 25, a notched portion is not provided in a silicon layer 201. A notched portion is not provided in silicon nitride layer 15a surrounding silicon layer 201. A bit line 241a is formed so as to fill a groove between silicon layers 201. A conductive layer 242 is formed in a desired shape on silicon layer 201 and bit line 241a. Conductive layer 242 causes source/drain region 7 formed in silicon layer 201 and bit line 241a to be electrically connected with each other.

Since the other configuration is substantially the same as that of the first embodiment, description will not be repeated.

In description of the first, the second and the third embodiments, the present invention was applied to a one transistor/one capacitor type memory cell. The present invention is not limited thereto, but may be applied to a connection structure of a transistor and an interconnection layer. Description will be given hereinafter of the case where the present invention is applied to a connection structure of a transistor and an interconnection layer connected thereto, as a fourth embodiment in comparison with a conventional example.

Figure 26:
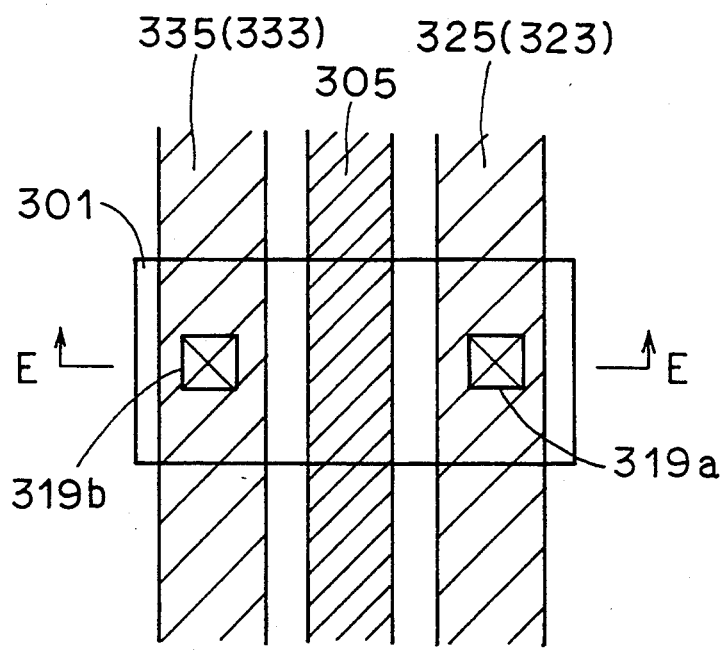
FIG. 26 is a plan view showing schematically a connection structure of a conventional MOS transistor and an interconnection layer connected thereto.
Figure 27:
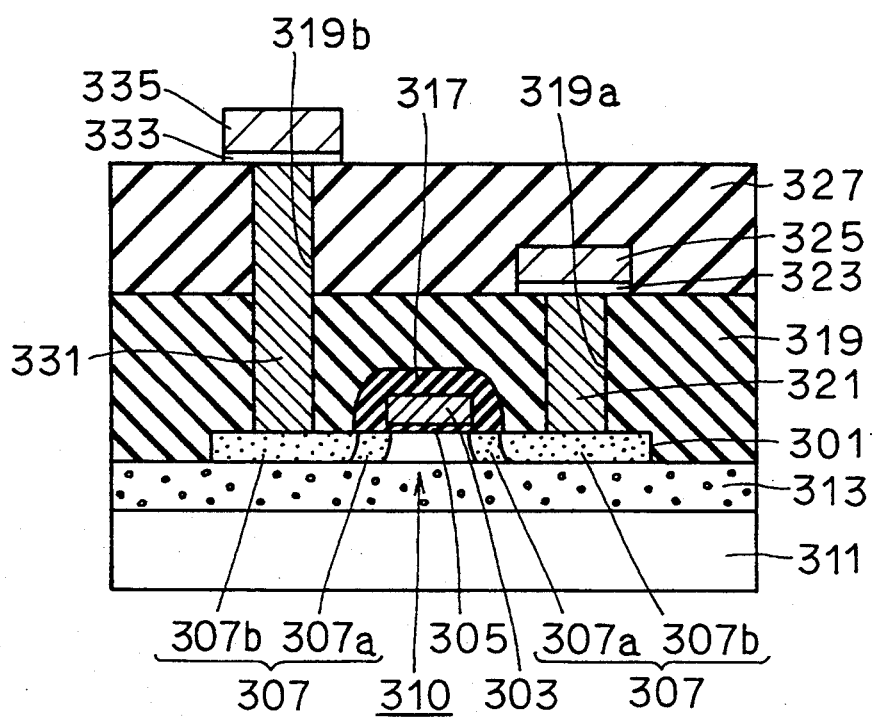
FIG. 27 is a schematic cross section taken along the line E—E of FIG. 26.

Referring to FIGS. 26 and 27, an interlayer insulating layer 313 is formed on the entire surface of a silicon substrate 311. Silicon layers 301 are formed on the surface of interlayer insulating layer 313 as islands. An MOS transistor 310 is formed using this SOI structure.

MOS transistor 310 includes a gate electrode 303, a gate insulating layer 305, and a pair of source/drain regions 307. The pair of source/drain regions 307 are formed in silicon layer 301 with a predetermined space. Source/drain region 307 has a two-layered structure of an impurity region 307a of a relatively low concentration and an impurity region 307b of a relatively high concentration, that is, a so-called LDD structure. On a region sandwiched by the pair of source/drain regions 307, formed is gate electrode 303 with gate insulating layer 305 interposed therebetween. An insulating layer 317 is formed so as to cover gate electrode 303.

An interlayer insulating layer 319 is formed on the entire surface of insulating layer 313 so as to cover MOS transistor 310. A contact hole 319a reaching one of the pair of source/drain regions 307 is formed in interlayer insulating layer 319. A plug layer 321 of a conductive layer is formed so as to fill contact hole 319a. An interconnection layer 325 is formed on first interlayer insulating layer 319 in contact with the upper surface of plug layer 321 with a barrier layer 323 interposed therebetween.

A second interlayer insulating layer 327 is formed on the entire surface of first interlayer insulating layer 319 so as to cover interconnection layer 325. In first and second interlayer insulating layers 319, 327, formed is a contact hole 319b, which penetrates these two layers to reach the other of the pair of source/drain regions 307. A plug layer 331 of a conductive layer is formed so as to fill contact hole 319b. A second interconnection layer 335 is formed on second interlayer insulating layer 327 in contact with the upper surface of plug layer 331 with a barrier layer 333 interposed therebetween.

When interconnection layers 325 and 335 connected to source/drain region 307 are thus formed on different layers, two layers of first and second interlayer insulating layers 319, 327 are required in the conventional structure. As a result, a surface stepped portion becomes relatively large in second interlayer insulating layer 327 positioned upper, making it difficult to carry out patterning of interconnection layer 335 accurately, similar to the above case.

Figure 28:
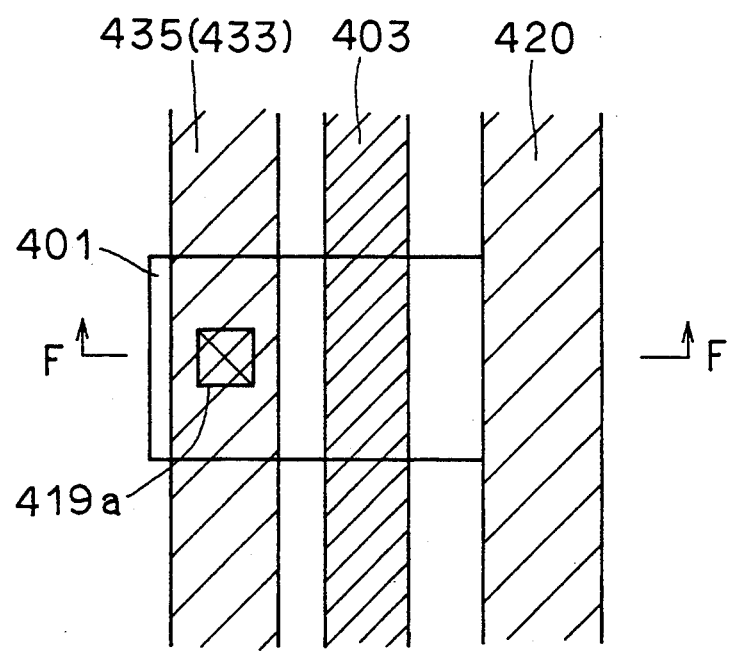
FIG. 28 is a plan view showing schematically a configuration of a semiconductor device according to a fourth embodiment of the present invention.
Figure 29:
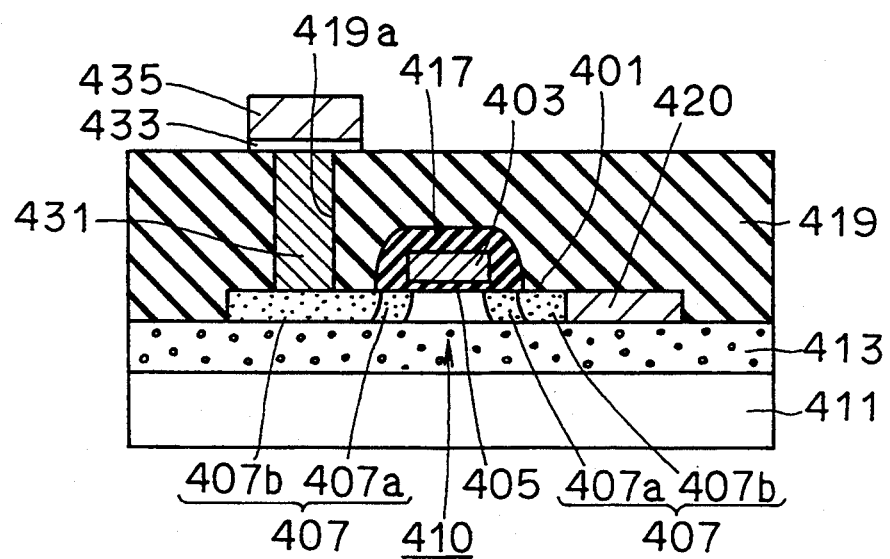
FIG. 29 is a schematic cross section taken along the line F—F of FIG. 28.
Figure 30:
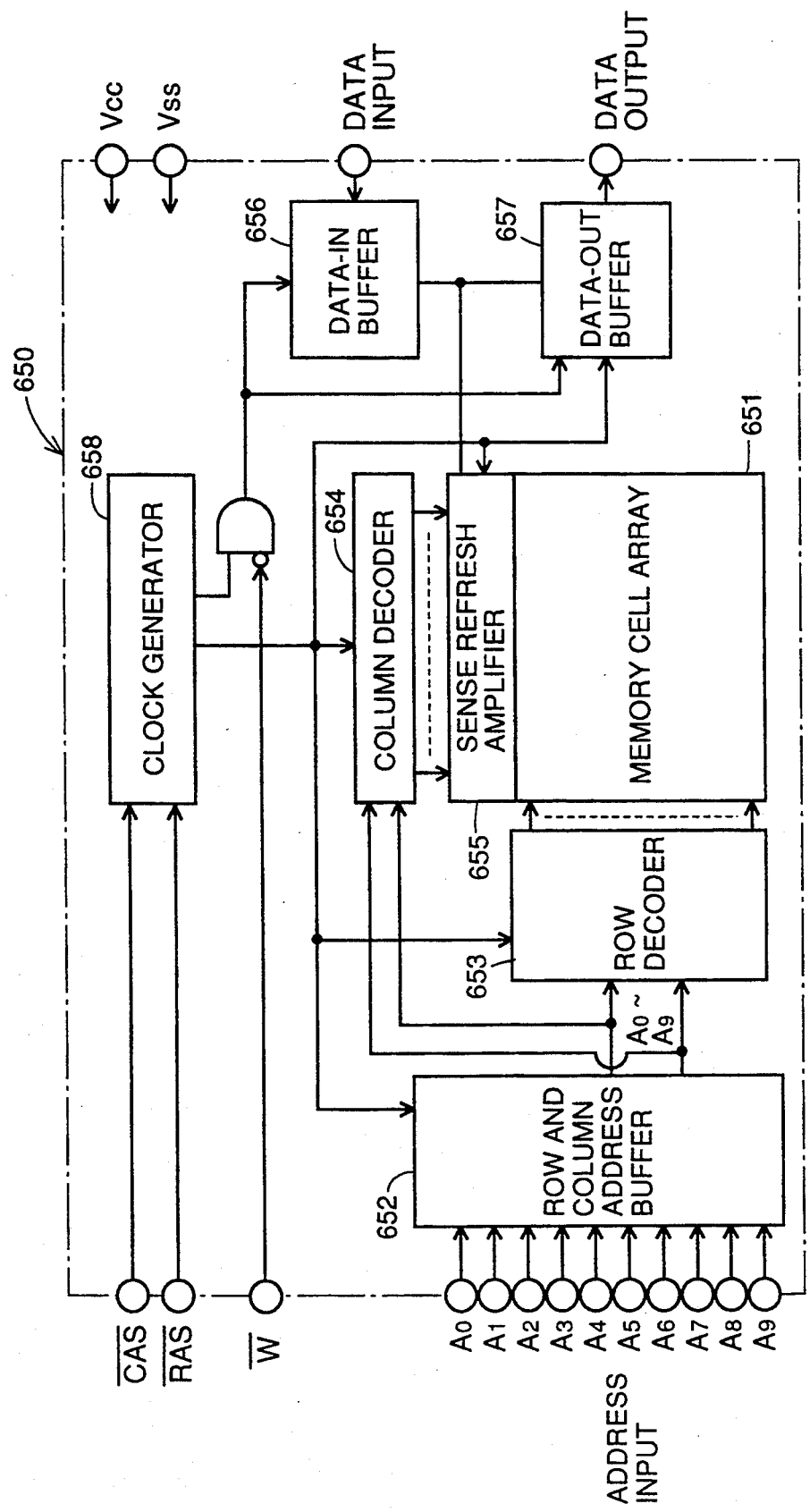
FIG. 30 is a block diagram of a general DRAM.
Figure 31:
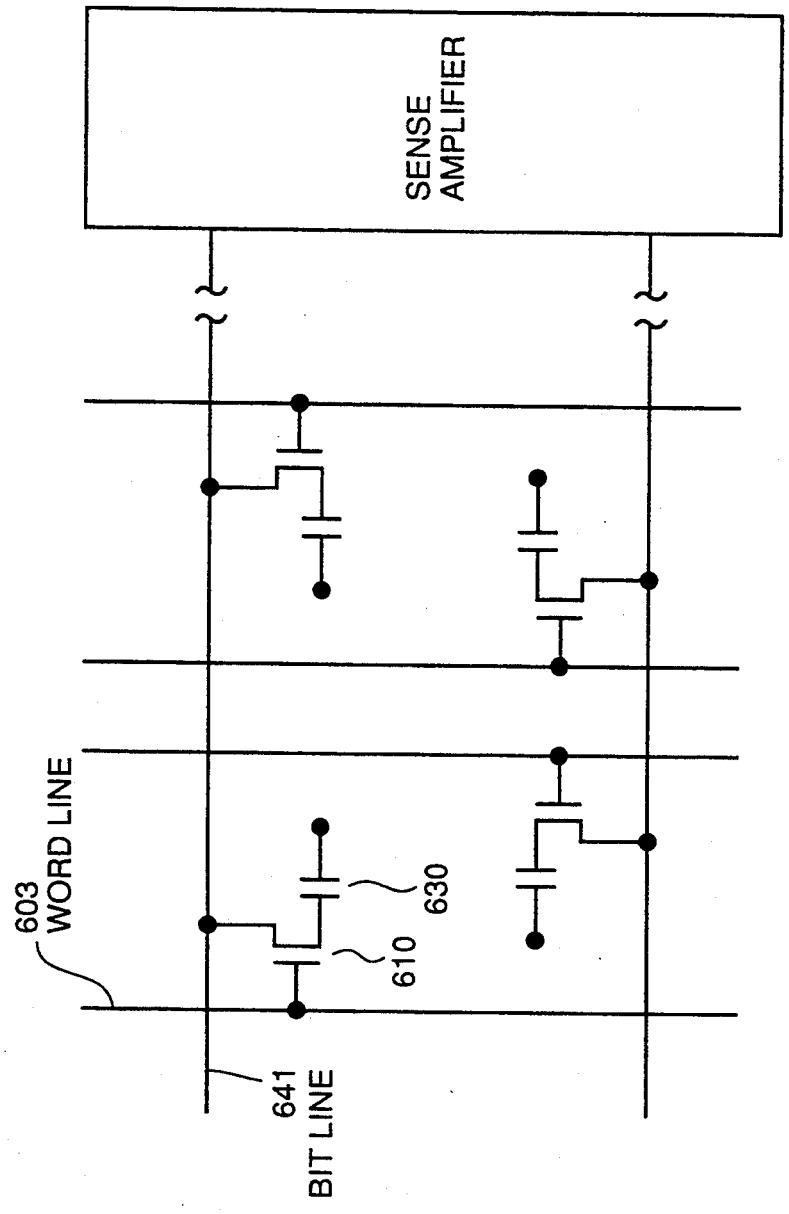
FIG. 31 is an equivalent circuit diagram for four bits for explaining a configuration of a memory cell array.
Figure 32:
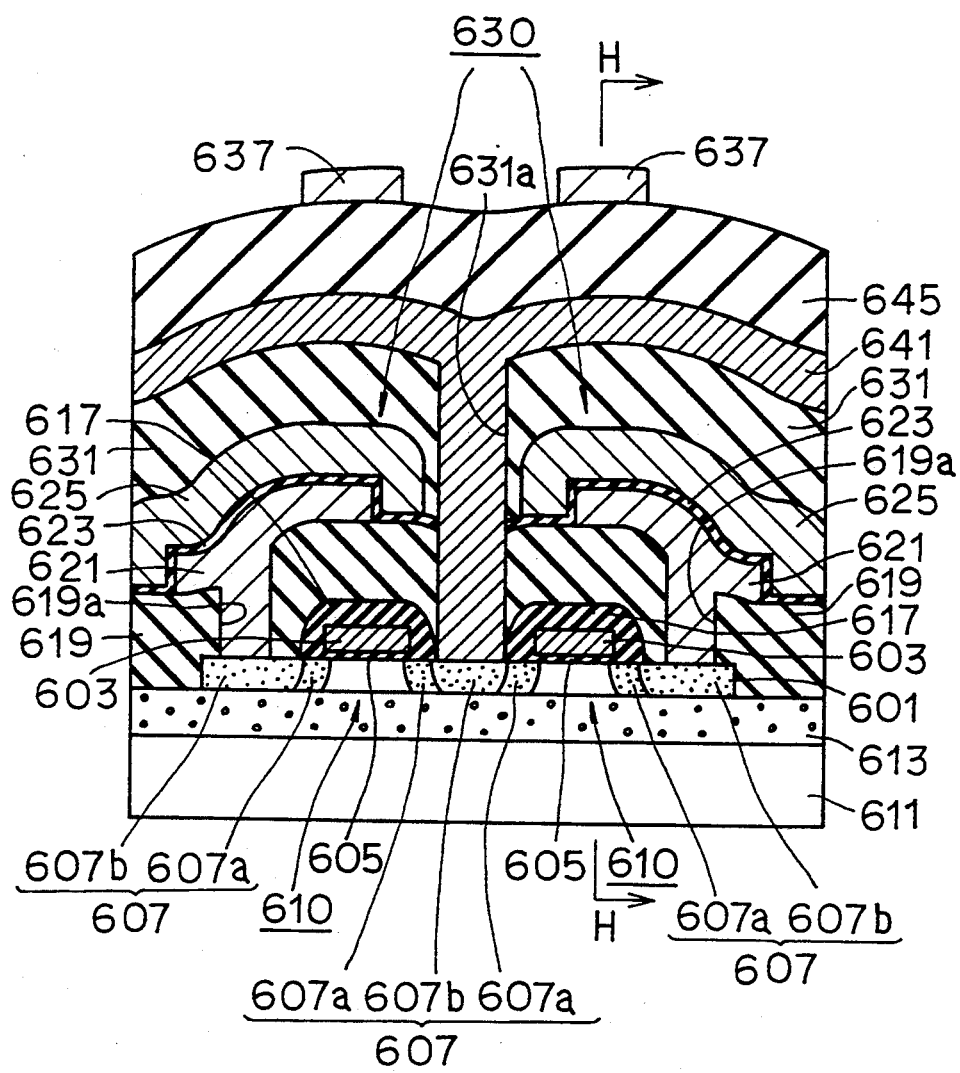
FIG. 32 is a cross section showing schematically a configuration of a conventional semiconductor device.
Figure 33:
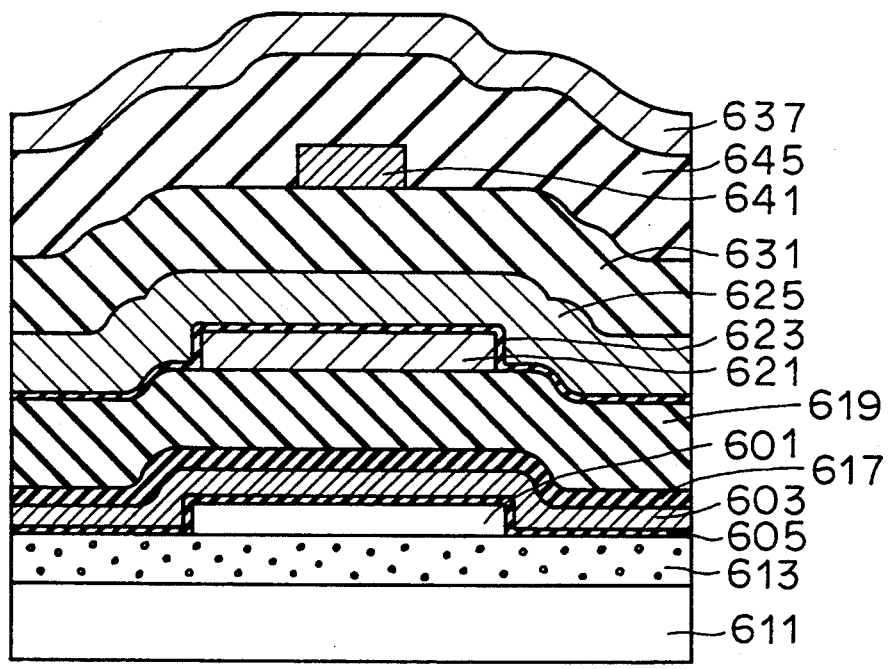
FIG. 33 is a schematic cross section taken along the line H—H of FIG. 32.
Figure 34:
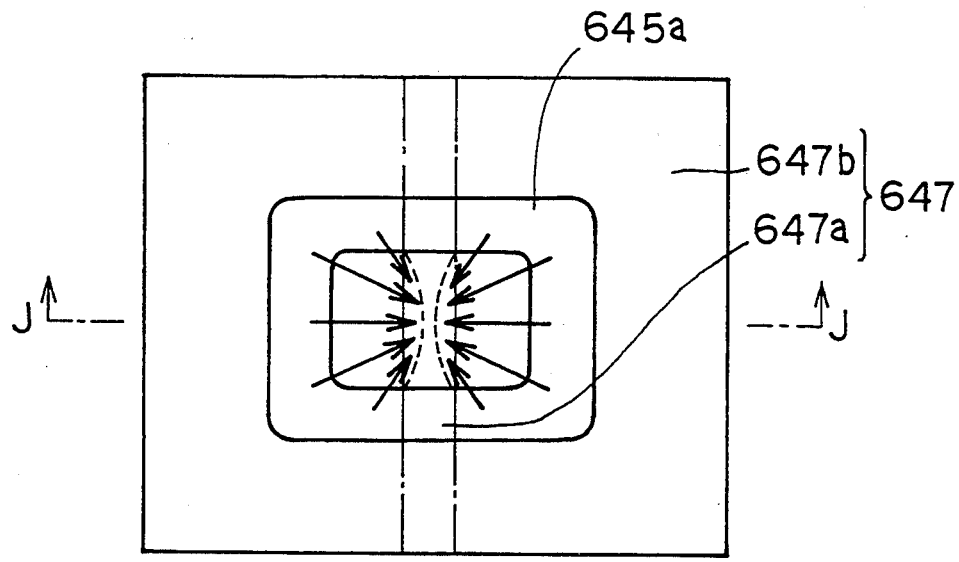
FIG. 34 is a schematic cross section for explaining a state where an interconnection is disconnected or deteriorated in shape in the conventional semiconductor device.
Figure 35:
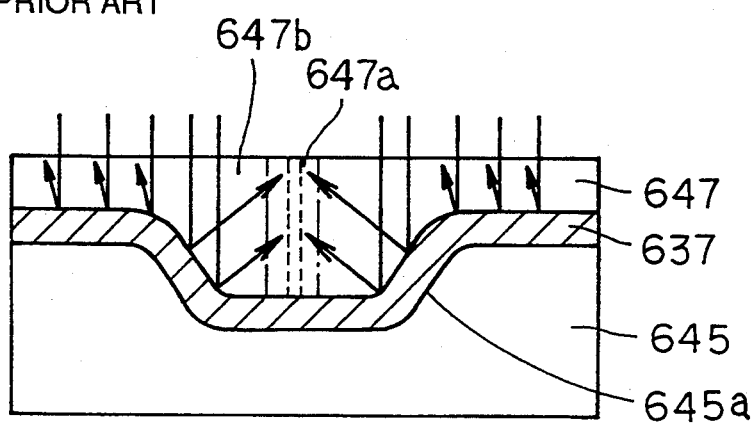
FIG. 35 is a schematic cross section taken along the line J—J of FIG. 34.
Figure 36:
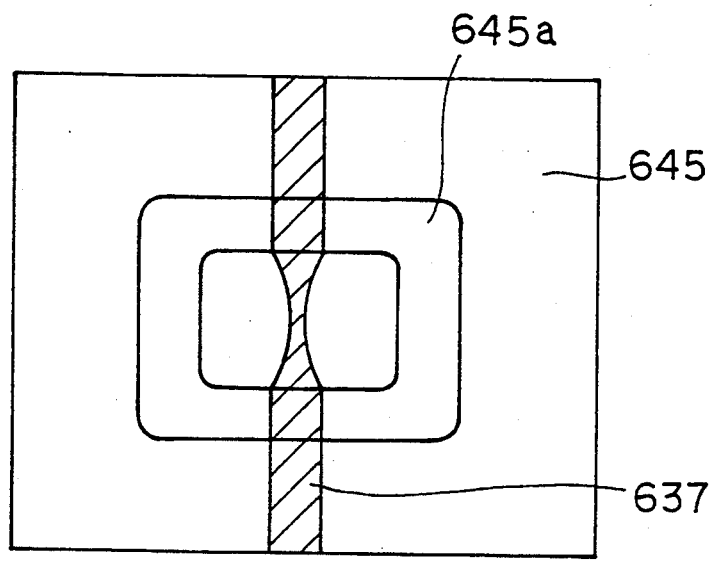
FIG. 36 is a schematic plan view showing the state where the interconnection layer is deteriorated in shape in the conventional semiconductor device.

Referring to FIGS. 28 and 29, in the semiconductor device of this embodiment, an SOI-MOSFET 410 having a gate electrode 403, a gate insulating layer 405, and a pair of source/drain regions 407 is formed in silicon layer 401 formed on a silicon substrate 11 with an insulating layer 413 interposed therebetween. Silicon layer 401 is formed in contact with the upper surface of insulating layer 413. A first interconnection layer 420 in contact with source/drain region 407 by contact with a sidewall of silicon layer 401 is also formed so as to extend in contact with the upper surface of insulating layer 413. More specifically, first interconnection layer 420 connected to the source/drain region of silicon layer 401 is formed on the same layer as silicon layer 401.

Since the other configuration is substantially the same as that shown in FIGS. 26 and 27, description will not be repeated.

As described above, since first interconnection layer 420 and silicon layer 401 are formed on the same surface, an interlayer insulating layer is not required between silicon layer 401 and first interconnection layer 420. Therefore, the surface stepped portion in the top interlayer insulating layer is prevented from being more significant in a multi-layered structure. The surface stepped portion of interlayer insulating layer 419 can be made smaller than that of second interlayer insulating layer 327 shown in FIG. 27. As a result, patterning of second interconnection layer 435 formed on the surface of interlayer insulating layer 419 with barrier layer 433 interposed therebetween can be carried out precisely, and it can be prevented that second interconnection layer 435 is deteriorated in shape or disconnected by patterning.

In the first, the second and the third embodiments, description was given of the structure in which the silicon layer and the bit line are connected to each other. The bit line and the silicon layer may be, however, integrally shaped. Although the structure in which the silicon layer and the first interconnection layer are in contact with each other has described also in the fourth embodiment, the silicon layer and the first interconnection layer may have an integral shape.

In the semiconductor device of the present invention, the semiconductor layer and the first conductive layer are formed on the upper surface of the first insulating layer in contact therewith. More specifically, the semiconductor layer and the first conductive layer are formed on a same layer. Therefore, it is possible to reduce the surface stepped portion of the interlayer insulating layer formed uppermost, and to carry out patterning of the interconnection layer on the surface of the interlayer insulating layer precisely. As a result, deterioration in shape or disconnection of the interconnection layer can be prevented.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:
    a semiconductor substrate having a main surface;
    a first insulating layer formed on the main surface of said semiconductor substrate;
    a semiconductor layer of a first conductivity type formed on and in contact with an upper surface of said first insulating layer;
    first and second impurity regions of a second conductivity type formed in said semiconductor layer with a predetermined space;
    a gate electrode layer formed on a region sandwiched by said first and second impurity regions with a gate insulating layer interposed therebetween;
    a first conductive layer connected to said first impurity region and extending on and in contact with an upper surface of said first insulating layer;
    a second insulating layer formed on said semiconductor layer and said first conductive layer and having an opening reaching said second impurity region; and
    a second conductive layer formed on said second insulating layer in contact with said second impurity region through said opening.

2. The semiconductor device as recited in claim 1, further comprising
    a sidewall insulating layer, wherein
    said sidewall insulating layer covers a sidewall of said semiconductor layer.

3. The semiconductor device as recited in claim 2, wherein
    said first conductive layer is connected to said first impurity region by contacting the sidewall of said semiconductor layer.

4. The semiconductor device as recited in claim 3, wherein
    said sidewall insulating layer has a first notched portion reaching the sidewall of said semiconductor layer from a sidewall of said sidewall insulating layer, and
    said first conductive layer is in contact with the sidewall of said semiconductor layer through said first notched portion.

5. The semiconductor device as recited in claim 4, wherein
    said semiconductor layer has a second notched portion in a portion having said first impurity region formed therein, and said first conductive layer is in contact with the sidewall of said semiconductor layer defining a shape of said second notched portion through said first notched portion.

6. The semiconductor device as recited in claim 2, wherein
said first conductive layer has an upper conductive layer and a lower conductive layer,
said lower conductive layer is formed at the sidewall of said semiconductor layer with said sidewall insulating layer interposed therebetween, and extends in contact with an upper surface of said first insulating layer, and
said upper conductive layer is in contact with an upper surface of said lower conductive layer and in contact with an upper surface of said semiconductor layer to be connected to said first impurity region.

7. The semiconductor device as recited in claim 1, further comprising
a capacitor, wherein
said second conductive layer serves as a lower electrode layer of said capacitor.

8. The semiconductor device as recited in claim 1, wherein
said first conductive layer serves as a bit line.

9. The semiconductor device as recited in claim 1, wherein
said gate electrode layer serves as a word line.

10. The semiconductor device as recited in claim 1, wherein
said first and second impurity regions serve as a pair of source/drain regions.

11. The semiconductor device as recited in claim 1, further comprising
a third insulating layer, and an interconnection layer, wherein
said third insulating layer is formed on said second conductive layer, and
said interconnection layer is formed on said third insulating layer.

12. The semiconductor device as recited in claim 1, further comprising
a plurality of semiconductor layers arranged in a first direction with a predetermined space from each other, a plurality of semiconductor layers arranged in a second direction crossing said first direction with a predetermined space from each other, and a sidewall insulating layer covering a sidewall of each of said semiconductor layers, wherein
said sidewall insulating layer fills between said semiconductor layers adjacent to each other arranged in said first direction, and
said sidewall insulating layer and said first conductive layer fill between said semiconductor layers adjacent to each other arranged in said second direction.

13. The semiconductor device as recited in claim 12, wherein
said respective first impurity regions formed in said respective plurality of semiconductor layers arranged in the first direction are connected by said first conductive layer.

14. The semiconductor device as recited in claim 13, wherein
said first conductive layer serves as a bit line.

15. The semiconductor device as recited in claim 11, wherein
said respective gate electrode layers formed on said plurality of semiconductor layers arranged in the second direction are electrically connected to each other.

16. The semiconductor device as recited in claim 15, wherein
said gate electrode layers electrically connected to each other serve as word lines.

17. A method of manufacturing a semiconductor device, comprising the steps of:
forming a first insulating layer on a main surface of a semiconductor substrate;
forming a semiconductor layer of a first conductivity type on an upper surface of said first insulating layer in contact with said upper surface;
forming a gate electrode layer on a part of a surface of said semiconductor layer with a gate insulating layer interposed therebetween;
forming first and second impurity regions of a second conductivity type in said semiconductor layer so as to sandwich a region of said semiconductor layer positioned directly under said gate electrode layer;
forming a first conductive layer connected to said first impurity region and extending in contact with an upper surface of said first insulating layer;
forming on said first insulating layer a second insulating layer covering said semiconductor layer and said first conductive layer and having an opening reaching said second impurity region; and
forming a second conductive layer on said second insulating layer in contact with said second impurity region through said opening.

18. The method of manufacturing a semiconductor device as recited in claim 17, further comprising the step of
forming a sidewall insulating layer so as to cover a sidewall of said semiconductor layer, wherein
said first conductive layer is formed at the sidewall of said semiconductor layer with said sidewall insulating layer interposed therebetween.

19. The method of manufacturing a semiconductor device as recited in claim 18, wherein
said step of forming the sidewall insulating layer includes the step of forming said sidewall insulating layer so as to have a first notched portion reaching the sidewall of said semiconductor layer from a sidewall of said sidewall insulating layer, and
said first conductive layer is formed in contact with the sidewall of said semiconductor layer through said first notched portion.

20. The method of manufacturing a semiconductor device as recited in claim 19, wherein
said step of forming the semiconductor layer includes the step of forming a second notched portion at a sidewall of a region of said semiconductor layer in which said first impurity region is to be formed, and
said first conductive layer is formed in contact with the sidewall of said semiconductor layer defining a shape of said second notched portion through said first notched portion.

21. The method of manufacturing a semiconductor device as recited in claim 18, wherein
said first conductive layer is formed so as to have an upper conductive layer and a lower conductive layer,
said lower conductive layer is formed at the sidewall of said semiconductor layer with said sidewall insulating layer interposed therebetween, and extends in contact with an upper surface of said first insulating layer, and said upper conductive layer is formed in contact with an upper surface of said lower conductive layer and in contact with an upper surface of said semiconductor layer to be connected to said first impurity region.

* * * * *